(12) United States Patent
Luo et al.

(10) Patent No.: US 9,958,784 B2
(45) Date of Patent: May 1, 2018

(54) SUPER-RESOLUTION IMAGING PHOTOLITHOGRAPHY

(71) Applicant: The Institute of Optics and Electronics, Chinese Academy of Sciences, Chengdu, Sichuan (CN)

(72) Inventors: Xiangang Luo, Chengdu (CN); Changtao Wang, Chengdu (CN); Zeyu Zhao, Chengdu (CN); Yanqin Wang, Chengdu (CN); Mingbo Pu, Chengdu (CN); Na Yao, Chengdu (CN); Ping Gao, Chengdu (CN); Chenggang Hu, Chengdu (CN); Xiong Li, Chengdu (CN); Cheng Huang, Chengdu (CN); Leilei Yang, Chengdu (CN); Liqin Liu, Chengdu (CN); Jiong Wang, Chengdu (CN); Jiayu He, Chengdu (CN); Yunfei Luo, Chengdu (CN); Kaipeng Liu, Chengdu (CN); Chengwei Zhao, Chengdu (CN); Ling Liu, Chengdu (CN); Xiaoliang Ma, Chengdu (CN); Min Wang, Chengdu (CN)

(73) Assignee: THE INSTITUTE OF OPTICS AND ELECTRONICS, CHINESE ACADEMY OF SCIENCES, Sichuan (CN)

( * ) Notice: Subject to any disclaimer, the term of this patent is extended or adjusted under 35 U.S.C. 154(b) by 0 days. days.

(21) Appl. No.: 14/909,734

(22) PCT Filed: Sep. 23, 2014

(86) PCT No.: PCT/CN2014/087182
§ 371 (c)(1),
(2) Date: Feb. 2, 2016

(87) PCT Pub. No.: WO2015/043450
PCT Pub. Date: Apr. 2, 2015

(65) Prior Publication Data
US 2016/0259253 A1   Sep. 8, 2016

(30) Foreign Application Priority Data

Sep. 24, 2013  (CN) .......................... 2013 1 0438387
Sep. 24, 2013  (CN) .......................... 2013 1 0439950

(51) Int. Cl.
*G03B 27/42*   (2006.01)
*G03F 7/20*    (2006.01)

(52) U.S. Cl.
CPC ............................. *G03F 7/70325* (2013.01)

(58) Field of Classification Search
CPC ............ G03F 7/70325; G03F 7/70341; G03F 7/2041; G03F 7/70308; G03F 7/70408;
(Continued)

(56) References Cited

U.S. PATENT DOCUMENTS

2005/0030506 A1    2/2005  Schuster
2005/0233262 A1*  10/2005  Luo .................... B82Y 10/00
                                              430/5
(Continued)

FOREIGN PATENT DOCUMENTS

CN       1553284 A     12/2004
CN       1564084 A     1/2005
(Continued)

OTHER PUBLICATIONS

Chinese Office Action dated Dec. 1, 2014, issued in Chinese Patent Application No. 201310438387.4, filed on Sep. 24, 2013, 16 pages.
(Continued)

*Primary Examiner* — Mesfin Asfaw
(74) *Attorney, Agent, or Firm* — Davis Wright Tremaine LLP; Michael J. Donohue

(57) ABSTRACT

Provided are apparatuses and methods for super resolution imaging photolithography. An exemplary apparatus may include an illumination light generation device configured to generate illumination light for imaging a pattern included in a mask through the mask. The illumination light may include a high-frequency spatial spectrum such that a high-frequency evanescent wave component of spatial spectrum information for the light is converted to a low-frequency evanescent wave component after being transmitted through the mask pattern. For example, the illumination light generation device may be configured to form the illumination in accordance with a high numerical aperture (NA) illumination mode and/or a surface plasmon (SP) wave illumination mode.

22 Claims, 15 Drawing Sheets

(58) Field of Classification Search
CPC ...... G03F 7/20; G03F 7/70125; G03F 7/7035; G03F 7/0002; G03F 7/70191; G03F 7/70141; G03F 7/7015; G03F 7/70; G03F 7/70058; G03F 1/22; G03F 1/26; G03F 1/36
See application file for complete search history.

(56) References Cited

U.S. PATENT DOCUMENTS

| 2010/0003605 | A1 | 1/2010 | Gil |
| 2010/0033701 | A1 | 2/2010 | Lee |
| 2011/0188032 | A1* | 8/2011 | Verma ............. G01N 21/00 356/237.2 |

FOREIGN PATENT DOCUMENTS

| CN | 101175989 A | 5/2008 |
| CN | 101441411 A | 5/2009 |
| CN | 101825845 A | 9/2010 |
| CN | 102866594 A | 1/2013 |
| CN | 202948246 U | 5/2013 |
| CN | 103293863 A | 9/2013 |
| CN | 103454866 A | 12/2013 |
| CN | 103472689 A | 12/2013 |
| EP | 2207063 A1 | 7/2010 |
| JP | H06250378 A | 9/1994 |
| JP | H08179493 A | 7/1996 |
| JP | H11233427 A | 8/1999 |
| JP | 2005328020 A | 11/2005 |

OTHER PUBLICATIONS

Chinese Office Action dated Nov. 2, 2014, issued in Chinese Patent Application No. 201310439950.X, filed on Sep. 24, 2013,9 pages.
Chinese Office Action dated Jul. 29, 2015, issued in Chinese Patent Application No. 201310439950.X, filed on Sep. 24, 2013, 6 pages.
Huang, S., "Comparative Investigations on Surface Plasmon Polariton Excited Via Metallic or Dielectric Grating," Masters Degree Dissertation, University of Science and Technology of China, Hefei, China, May 2012, 72 pages (English Abstract).
Devaux E., et al., "Launching and Decoupling Surface Plasmons Via Micro-Gratings," Applied Physics Letters, 83(24):4936-4938, Dec. 15, 2003.
Blaikie R.J., et al., "Super-Resolution Near-Field Lithography Using Planar Silver Lenses: A Review of Recent Developments," Microelectronic Engineering, 83:723-729, 2006.
Wang, P. et al., "Nano-Photolithography Using Super-Resolution Near-Field Structure," Chinese Journal of Quantum Electronics 22(6):840-843, Dec. 31, 2012.
International Search Report dated Dec. 30, 2014, in International Patent Application No. PCT/CN2014/087182, filed Sep. 23, 2014, 8 pages.
Pendry, J. B., "Negative Refraction Makes a Perfect Lens," Physical Review Letters, 85(18):3966-3969, Oct. 30, 2000.
Fang, N. et al., "Sub-Diffraction-Limited Optical Imaging With a Silver Superlens," Science 308:534-537, Apr. 22, 2005.
Gaofeng, L., "Study on Subwavelength Gratings Based on Multilayer Structure," Acta Physica Sinica 61(10): 104203-1-104203-6, 2012.
Extended European Search Report dated Apr. 5, 2017, issued in corresponding Application No. EP14848976.8, filed Sep. 23, 2014, 10 pages.
Japanese Office Action dated Sep. 6, 2016, issued in Japanese Patent Application No. 2016-505702, 9 pages.

* cited by examiner

SUPER-RESOLUTION IMAGING PHOTOLITHOGRAPHY

TECHNICAL FIELD

The present disclosure generally relates to the field of photolithography, and in particular, to a method, a device, and an apparatus for contactless super-resolution optical imaging photolithography.

BACKGROUND

With development of the optical imaging photolithography technology, the Rayleigh resolution limit becomes a main obstacle that limits optical resolving power. Due to a limited numerical aperture (NA) for an objective lens imaging system, the resolution of the line width for the optical photolithography under a single-exposure condition is typically limited to about a quarter of the wavelength of the illumination light. The super-resolution optical imaging photolithography will be very important for improving the resolution and the lifecycle of the optical photolithography technology. Further, it is possible to provide a novel nano fabrication approach at low cost and high resolution for the field of micro-nano scale technology and industry.

The Superlens imaging technology based on the surface plasmon (SP) effect is a novel super-resolution optical imaging method that is drawing more attention recently. It originated from the perfect lens with the negative refractive index proposed by Prof. Pendry, Imperial College, U.K., (Pendry J B, Negative Refraction Makes a Perfect Lens, Phys. Rev. Lett. 85, 3966-3969 (2000)). A perfect lens with the negative permittivity and permeability can amplify evanescent wave components which carry sub-wavelength structural information of an object. In this way, all wave vector components could arrive at an image plane and thus participate in imaging without loss, and therefore perfect imaging without aberration and resolution limit can be achieved theoretically. However, there is no negative refraction material in the nature world. By using a metal film with negative permittivity, SPs could be excited under an incident light in a Traverse Magnetic (TM) polarization, thereby achieving the super-resolution imaging effect on both sides of the metal film.

In 2005, researchers from UC Berkeley achieved a photolithography result, with 60 nm half pitch resolution, by using a normally incident i-line illumination light from a mercury lamp (with a central wavelength of 365 nm) as a light source, and providing a PMMA (PolyMethylMethAcrylate) dielectric layer with a thickness of 40 nm, a thick metallic silver film with a thickness of 35 nm, and a photoresist photosensitive layer on a 50 nm thick chromium mask layer with a nano pattern (Fang N, Lee H, Sun C, Zhang X, Sub-diffraction-limited optical imaging with a silver superlens, Science 308: 534-537 (2005)).

On the other hand, the nano optical photolithography can also be achieved by using the local field enhancement effect and short wavelength interference effect of SPs.

Essentially, the SP imaging photolithography belongs to the near-field photolithography. The Canon company, Japan, proposes a near-field nano optical photolithography tool, in which a deformable film of SiN is used as a carrier for mask pattern, and a tight contact between the mask pattern and an upper surface of photoresist on a silicon wafer is achieved by vacuum pressure. In this way, a pattern with line-width resolving power of 32 nm or below is achieved. The main difficulty faced by the nano optical photolithography based on superlens is that the air distance between the mask structure and the photolithography substrate structure (such as, a silicon wafer) is very short. For example, the super resolution imaging technology which uses the superlens to achieve 50 nm line width resolution or below allows an working distance of only several nano-meters, very close to zero. As a result, all existing super resolution imaging technologies based on superlens adopt contacting mode in photolithography processes. In other words, the mask structure is physically contacted with the resist layer on a wafer. Obviously, such contacting mode would cause damages to the masks. It is well known that the mask with precision pattern structure is usually expensive. In order to maintain a certain lifecycle of the mask, it is desirable to extend the distance between the mask structure and the photolithography substrate structure as large as possible to prevent physically touching to each other, under the premise that the imaging resolving power is maintained. In view of the current high-precision processing level for optical planes, the attainable flatness of a device surface within a small area (for example, within a diameter of 10 mm) may be typically controlled within about 10 nm. For this reason, it is desirable to extend the distance between the mask structure and the photolithography substrate structure, for example, beyond several tens of nano-meters, to achieve a separation of these two structures. This provides an important and possible solution to achieve a contactless super-resolution imaging optical photolithography. Thus, it is desirable to design a novel super resolution imaging photolithography structure for improving the resolution of the imaging photolithography, the image contrast, and the focus depth in case of a relatively large air distance.

SUMMARY

The present disclosure aims to provide, among others, a method and an apparatus for implementing contactless super resolution imaging photolithography.

According to an embodiment of the present disclosure, an apparatus for imaging photolithography is provided. An exemplary apparatus may comprise an illumination light generation device configured to generate illumination light which can pass through a mask and then image a pattern included in the mask. The illumination light may comprise a high-frequency spatial spectrum such that a high-frequency evanescent wave component of spatial spectrum information for the light is converted to a low-frequency evanescent wave component after being transmitted through the mask pattern. For example, the illumination light generation device may be configured to form the illumination light in accordance with a high numerical aperture (NA) illumination mode and/or a surface plasmon (SP) wave illumination mode.

According to another embodiment of the present disclosure, a method for super-resolution imaging photolithography is provided. The method may comprise: forming illumination light containing a high-frequency spatial spectrum in accordance with an SP wave illumination mode and/or a high NA illumination mode; using the illumination light to illuminate a mask pattern, resulting in light transmitted through the mask pattern, wherein a high-frequency evanescent wave component of spatial spectrum information is converted to a low-frequency evanescent wave component for the transmitted light; and projecting the transmitted light through a certain gap onto a substrate to image the mask pattern on the substrate.

According to embodiments of the present disclosure, it is possible to extend a gap between a mask substrate structure and a photolithography substrate structure by using the high NA and/or SP illumination, and optionally in conjunction with an accessorial groove structure for the mask pattern and an accessorial imaging photolithography structure of metal-resist-metal, while improving the imaging contrast and the imaging photolithography quality, thereby achieving a method, a device structure, and an apparatus for contactless super-resolution imaging photolithography.

BRIEF DESCRIPTION OF THE DRAWINGS

The above and other objects, features, and advantages of the present disclosure will become apparent from the following descriptions of embodiments thereof with reference to the drawings, in which:

FIGS. 3(a)-3(c) are a schematic view showing a prism illumination structure for achieving super-resolution imaging photolithography according to an embodiment of the present disclosure, wherein FIG. 3a is a schematic view showing a roof prism illumination structure, FIG. 3b is a schematic view showing a square frustum of pyramid prism illumination structure, and FIG. 3c is a cross sectional view showing an imaging photolithography structure;

FIG. 8 shows simulation results of imaging photolithography for a 2D dense line pattern with a line-width of 60 nm and an air gap of 50 nm under different illumination modes according to an embodiment of the present disclosure, wherein FIG. 8(a) represents an imaging photolithography simulation result in case of Off Axis Illumination with NA=1.5, FIG. 8(b) represents a light intensity distribution curve along the white dashed line in FIG. 8(a), FIG. 8(c) represents an imaging photolithography simulation result in case of Normal Illumination with NA=0, and FIG. 8(d) represents a light intensity distribution curve along the white dashed line in FIG. 8(c);

FIG. 11 shows an imaging photolithography result for a 1D dense line pattern with a line-width of 32 nm and a comparison between light intensity distribution curves in an imaging space under different illumination modes according to an embodiment of the present disclosure, wherein FIG. 11(a) shows a cross sectional view of a simulated light field in an SP wave illumination mode, FIG. 11(b) shows an magnified cross sectional view of the simulated light field for a photosensitive layer region within the white box of FIG. 11(a), and FIG. 11(c) shows the comparison between light intensity distribution curves in the imaging space under different illumination modes in which NA=0 corresponds to Normal Illumination, and NA=2.5 corresponds to SP wave illumination;

FIG. 12 shows imaging photolithography results for a 2D dense line pattern with a line-width of 32 nm according to an embodiment of the present disclosure, wherein FIG. 12(a) is a schematic view showing a 2D super-resolution imaging photolithography structure in an SP wave illumination mode, FIG. 12(b) shows a simulated result of the imaging for a photosensitive layer region and a light intensity distribution curve along the white dashed line in the SP wave illumination mode, FIG. 12(c) is a schematic view showing a comparative super-resolution imaging photolithography structure in a Normal Illumination mode, and FIG. 12(d) shows a simulated result of the imaging for a photosensitive layer region and a light intensity distribution curve along the white dashed line for the comparative structure;

FIG. 14 shows a simulation result of an imaging light field within photoresist for an L-shaped sparse line pattern under Off Axis Illumination with a groove structure incorporated according to an embodiment of the present disclosure, wherein FIG. 14(a) shows an imaging light field distribution for a photosensitive layer region under Off Axis Illumination with the groove structure incorporated, FIG. 14(b) shows an imaging light field distribution for a comparative structure (under Normal Illumination and without groove structure), FIG. 14(c) is a diagram showing a comparison of light intensity distribution curves along the white dashed lines of FIG. 14(a) and FIG. 14(b), respectively, and FIG. 14(d) shows imaging widths in a photosensitive layer region under different air gaps.

DETAILED DESCRIPTION

Figure 1:
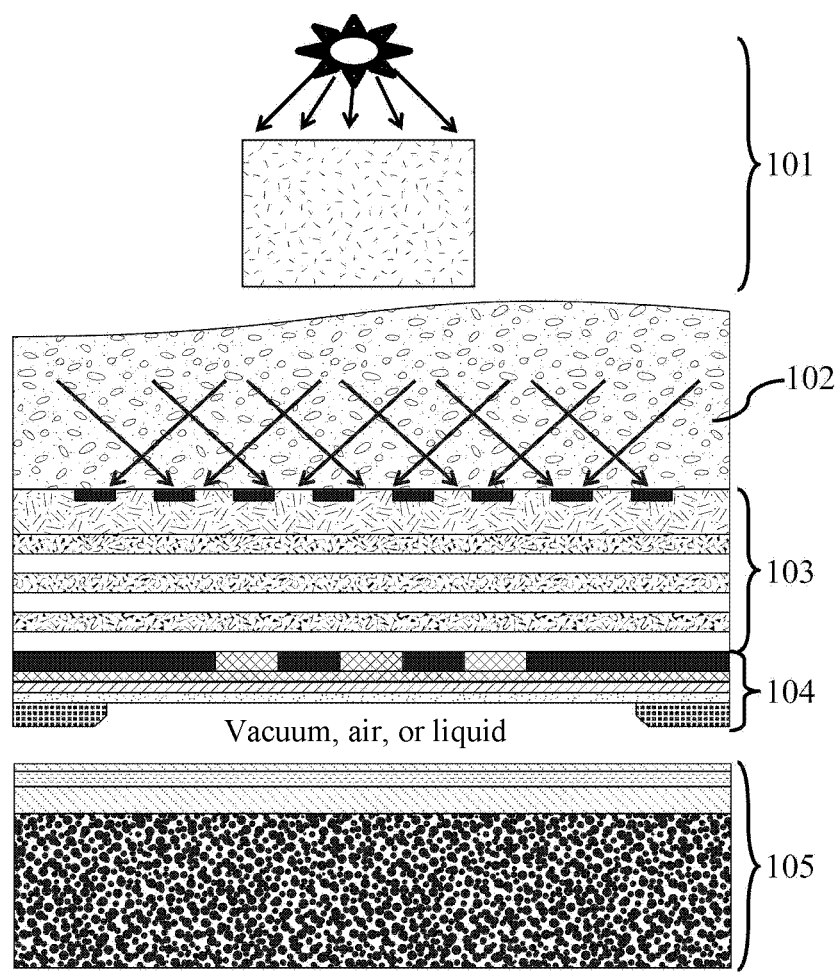
FIG. 1 is a partial view schematically showing a super-resolution imaging photolithography apparatus according to an embodiment of the present disclosure.

Hereinafter, embodiments of the present disclosure will be described with reference to the drawings, and thus the above and other objects, features, and advantages of the present disclosure will become apparent to one skilled in the art. Throughout the figures, same or similar elements will be denoted by same or similar reference numerals, and repeated descriptions thereof will be omitted. For the purpose of clarity, various parts in figures are not necessarily drawn to scale. Furthermore, in the description below, well-known structures and technologies may be omitted so as not to unnecessarily obfuscate the concept of the present disclosure.

The main reason why the conventional near-field optical photolithography and the superlens imaging photolithography cannot be achieved via a contactless mode is that: in the gap space, such as, air or liquid, an evanescent wave which carries sub-wavelength pattern information of a mask decays rapidly as leaving the surface of the superlens. And thus high frequency component information is lost, resulting in rapidly decreased imaging resolution and photolithography contrast which are insufficient to achieve effective imaging photolithography.

According to an embodiment of the present disclosure, a high NA off axis illumination mode and/or a SP wave illumination mode may be selected in accordance with a line width of a mask pattern and a pattern structure for super resolution imaging photolithography The high NA off axis illumination mode and/or the SP wave illumination mode can adjust a spatial spectrum distribution of light that is transmitted through the mask pattern, such that high frequency information of the mask pattern is converted from a high frequency evanescent wave to a low frequency evanescent wave component. In this way, the damping degree of sub-wavelength pattern evanescent wave information in the super-resolution imaging is reduced, and thus imaging photolithography via a gap at a relatively long working distance can be achieved.

Assume an example of a dense periodic line mask pattern. When a working distance between a mask structure and a photolithography substrate structure is large enough, only order 0 of the light which is transmitted through the mask pattern arrives at and thus exposes the photolithography substrate, while other orders of evanescent waves decay quickly, resulting in greatly reduced resolving power for the imaging photolithography. By using a SP wave illumination, a transversal wave vector of the SP wave illumination is adjusted such that the light transmitted through the grating mask is shifted in terms of spatial frequency. In this way, only order +1 (and/or order −1) and order 0 of diffraction light are coupled to the imaging space for coherent super position. Due to the reduction of a proportion of the zero-frequency wave vector component in the spectral space, imaging contrast can be improved. Furthermore, in combination with accessorial imaging metal film structures incorporated on both sides of a photosensitive layer, a ratio of a longitudinal electric polarization component to a transverse electric polarization component in the imaging space region can be suppressed. In this way, negative impacts of the longitudinal electric polarization component in the imaging field on the imaging quality can be reduced, such that the imaging contrast can be further improved. Advantageously, these two mechanisms may be combined together to extend the gap between the mask pattern structure and the photolithography substrate structure, such that the problems of the reduced resolving power and the short working distance in the near-field optical photolithography can be addressed. In this way, it is possible to achieve super resolution imaging photolithography even in the case where the mask pattern layer and the photolithography substrate are separated by a gap, and to achieve a photolithography pattern imaged at a high contrast. Further, by means of the super resolution imaging photolithography via a large gap, it is possible to improve the efficiency of photolithography, reduce the abrasion of the mask, and increase the lifecycle of the mask, thereby facilitating in mask pattern alignment at a high precision in optical photolithography.

As shown in FIG. 1, a super resolution imaging photolithography apparatus according to an embodiment of the present disclosure may comprise an illumination system 101, a mask substrate 102, a SP wave illumination excitation structure 103, a mask structure 104, and a photolithography substrate structure 105. There may be an isolation layer of air, vacuum, or liquid, with a thickness of 20 nm to 200 nm, for example, between a bottom surface of the mask structure 104 and an upper surface of the photolithography substrate structure 105. The physical isolation between the mask structure 104 and the photolithography substrate structure 105 facilitates in protecting a mask pattern. The respective constitutions and structures of the illumination system 101, the mask structure 104, and the photolithography structure 105 and the thickness of the isolation layer may be chosen based on the line width and dimension of the photolithography pattern and convenience for implementing them or the like.

The illumination system 101 may comprise a light source, alight homogenizer, and a high NA (for example, 0<NA<1.8) light shaper. The NA of the illumination is defined as a product of "sine of an angle between a principal ray of the illumination field and the normal to an illuminated surface" and "a refractive index of an illuminated space." For example, in order to achieve an off axis illumination light with a high NA, the light shaper may be selected from but not limited to: a solid or liquid immersion type projection illumination structure (as shown in FIG. 2), a solid prism illumination structure of a high refractive index material (as shown in FIG. 3), or a grating illumination structure (as shown in FIG. 4).

Figure 2:
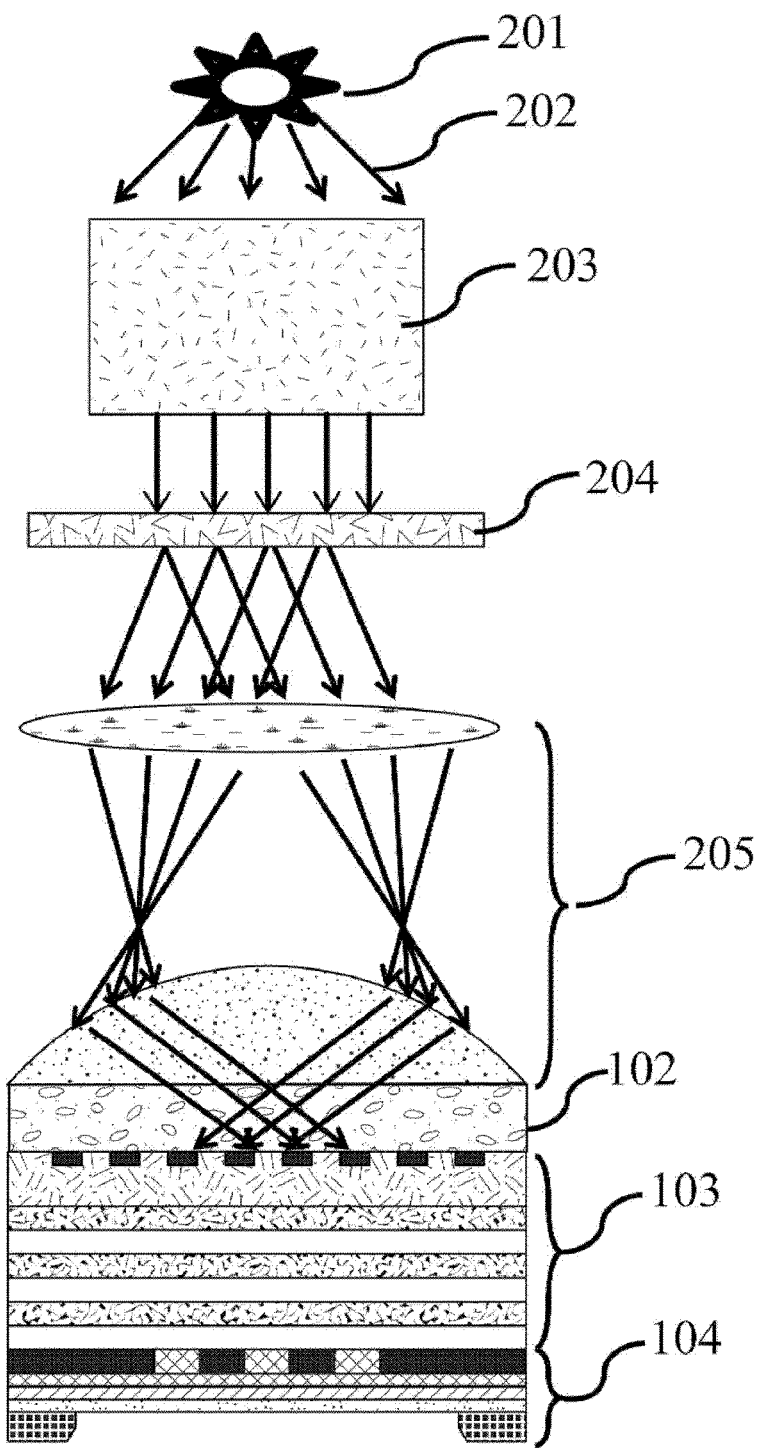
FIG. 2 is a schematic view showing a solid or liquid immersion type projection illumination structure for achieving super-resolution imaging photolithography according to an embodiment of the present disclosure.
Figure 3A:
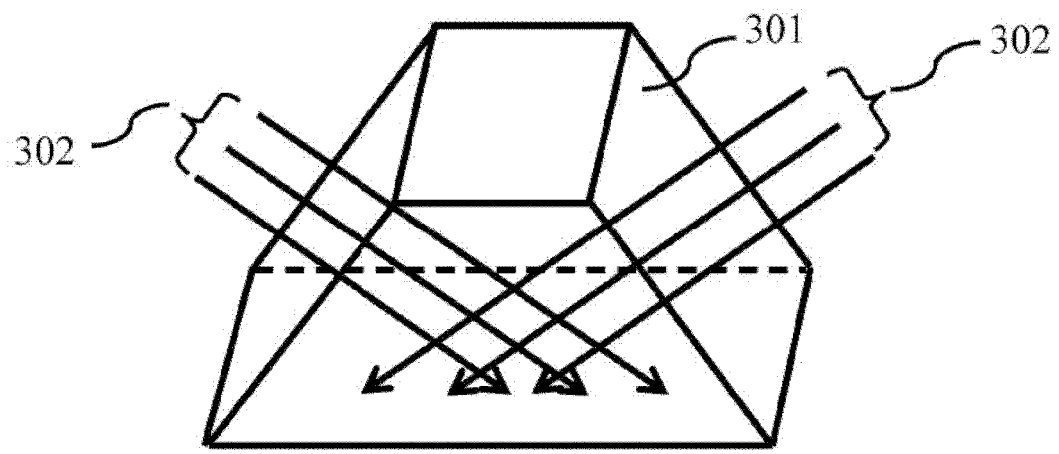
Figure 3B:
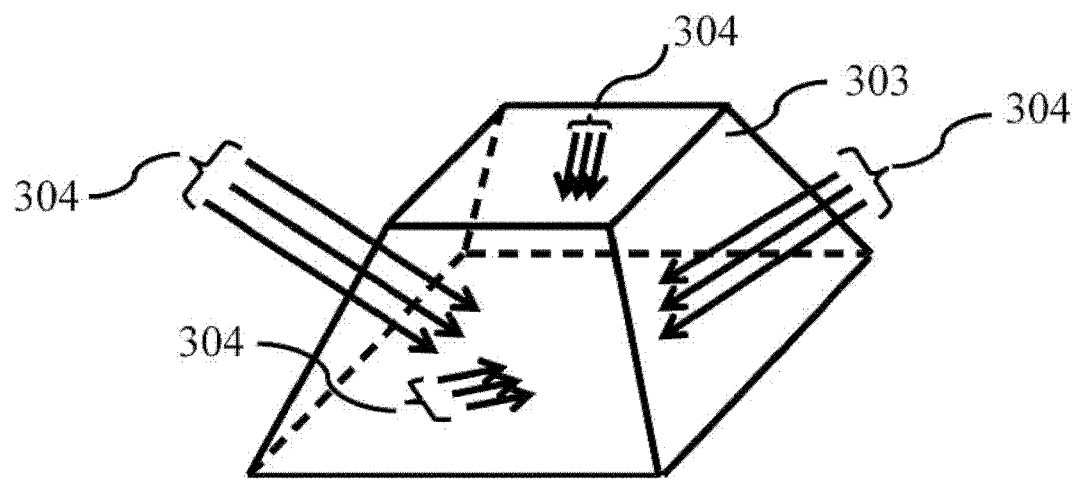

FIG. 2 is a schematic view showing a solid or liquid immersion type projection illumination structure according to an embodiment of the present disclosure. As shown in FIG. 2, a light field 202 with a non-uniform intensity emitted from a light source 201 may be changed by a light homogenizer 203 into a light beam with a uniformly distributed intensity. A light shaping element 204 may be used to shape the normally incident illumination light into a far-field dipolar, quadripolar, or annular illumination. In this case, it is assumed that the angle of the principal illumination ray is $\theta_1 < \theta$, where $\theta$ is an expected illumination aperture angle. A projection optical system 205 with a magnification factor of M may be further adopted (205 in FIG. 2 represents a simple schematic structure of an immersion type projection illumination system). The imaging side of the optical system 205 may be immersed in liquid or solid. The angle of the principal illumination ray is enlarged to $M*\sin\theta_1 = \sin\theta$, and the light field intensity within the illumination area is kept uniform.

FIG. 3 shows a solid prism illumination structure made of a high refractive index material according to an embodiment of the present disclosure. As shown in FIG. 3, the uniform illumination light beam 302 or 304 may be divided into two or four beams, which are then symmetrically incident from two side faces or four side faces into the prism 301 or 303, respectively. As a result, a uniform illumination field having an incident angle defined by equation (1) can be generated on a bottom surface of the prism. With respect to a 2D pattern of lines arranged in 2D orthogonal directions, the prism may comprise a frustum of square pyramid prism 303. The direction of the lines in the mask pattern may substantially perpendicular to the direction of the illumination light.

The material for the prisms 301 and 303 may be selected based on the wavelength $\lambda_0$ of the illumination light beam. For example, a transparent glass material with a high refractive index under the wavelength of the illumination light beam may be selected. For example, in a case where the illumination light beam has a wavelength of 365 nm, the material for the prism may comprise but not limited to sapphire glass, fused quartz, or other material that is capable of transmitting ultraviolet light.

FIG. 4 is a schematic view showing a grating illumination structure according to an embodiment of the present disclosure. As shown in FIG. 4, a 1D or 2D grating 402 and a multi-film filter 403 may be loaded on top of the mask substrate 102 to achieve a high NA off axis illumination light field at a certain angle. The direction in which the grating 402 is arranged may be substantially the same as the direction in which the lines in the mask pattern are arranged. With respect to the normal incident, uniform illumination light field 401, the period of the grating 402 may selected to enable the diffraction orders +1 and −1 to satisfy equation (1). That is:

$$n \times d\_grating \times \sin \theta = \lambda_0 \quad (1)$$

where d_grating denotes the period of the grating 402, n denotes the refractive index of the material of the mask substrate, θ denotes the angle between the principal ray of the illumination light (for example, light at diffraction orders +1 and −1) in the substrate and the normal direction to an illuminated surface, and $\lambda_0$ denotes the wavelength of the light source in vacuum.

In order to screen the other orders including order zero of grating diffraction, one or more F-P cavities 403 composed of multiple layers of metal film 4031 and dielectric film 4032 may be introduced below the grating 402. The diffracted light at orders +1 and −1 satisfies the resonance conditions and thus can transmit efficiently, whereas the transmittance for other orders is close to zero. Further, in order to suppress the problem of interference noise caused by the coherence of the diffracted light at orders +1 and −1 of the grating 402; the thickness of the mask substrate 102 may be much larger than a coherence length of the light source.

According to an embodiment of the present disclosure, it is desirable to eliminate the coherence of the illumination light as much as possible. This is because the coherence of the light not only brings coherence noise which affects the light uniformity, but also results in interference of the imaging field which causes non-uniformity. Typically, the partially coherence feature of light field which is produced by a commonly used light source for photolithography, such as a g-line or i-line of a mercury lamp, an ArF laser with a wavelength of 193 nm, or a KrF laser light source with a wavelength of 157 nm, should be enough to meet the application requirements. However, a special structure which is designed to further reduce the coherence of the light may be included. On the other hand, with respect to a laser light source with a relatively large coherence length, such as, a YAG frequency tripled laser device, a gas laser device, or the like, it is desirable to incorporate a structure into the illumination system for reducing the coherence of the light. One skilled in the art may contemplate various ways to reduce the coherence of the light, and detailed descriptions thereof are omitted here for simplicity.

According to another embodiment of the present disclosure, it is desirable to achieve a highly uniform intensity distribution of the illumination light (for example, the fluctuation of the light intensity is less than 3%) in the same illumination manner within substantially the whole area of the mask pattern illumination region. One skilled in the art may contemplate various ways to homogenize the illumination, and detailed descriptions thereof are omitted here for simplicity. However, for some mask patterns, for example, a case where a micrometer-scale pattern and a nanometer-scale pattern with different line widths are all fabricated in a mask, it may be contemplated to choose illumination light with different illumination modes in the micrometer-scale pattern and in the nanometer-scale pattern region with different line width, respectively, in consideration of feasibility. One skilled in the art may contemplate to various implementations, and detailed descriptions thereof are omitted here for simplicity.

According to another embodiment of the present disclosure, in view of the compatibility with a general mask pattern structure, the illumination light may be in a natural polarization mode. For some patterns, for example, a 1D line pattern, a polarizer may be incorporated into the illumination light path such that the polarization direction of the electric field is substantially perpendicular to the line direction. In this way, the contrast of the super resolution image field may be promoted to some extent, and the photolithography effect may be improved. One skilled in the art may contemplate various implementations, and detailed descriptions thereof are omitted for simplicity.

Further, in order to improve the illumination power, the illumination light may have a certain divergence angle. The divergence angle may be within a range of ±10°.

Furthermore, the light source may have a wavelength that is matched with the material of the photosensitive layer, comprising but not limited to a g-line or i-line of a mercury lamp, an ArF light source with a wavelength of 193 nm, a KrF light source with a wavelength of 157 nm, or the like.

Figure 5:
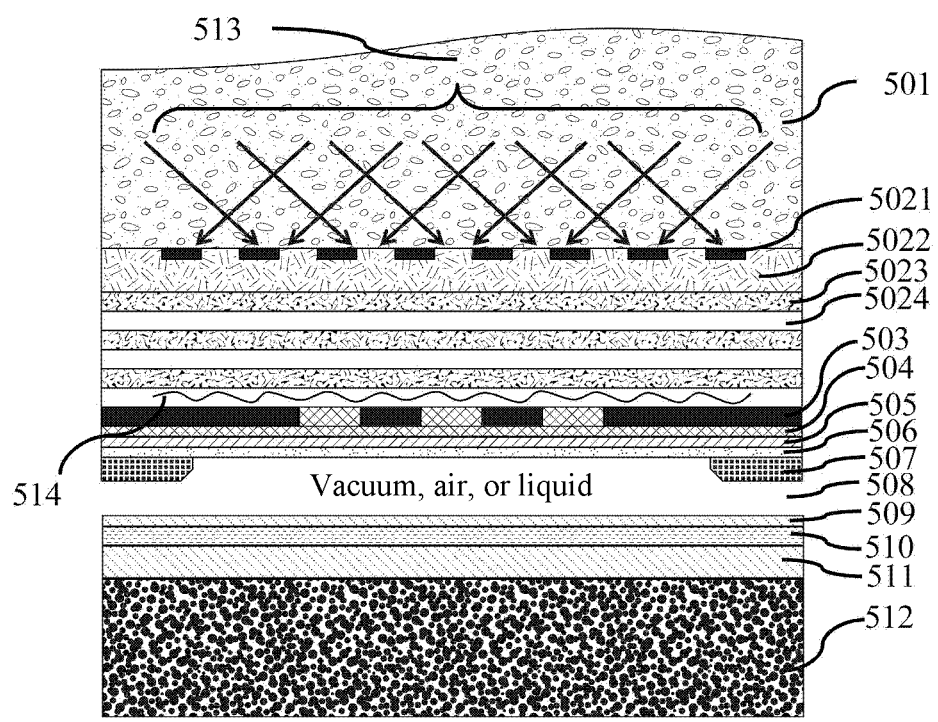
FIG. 5 is a partial view schematically showing a super-resolution imaging photolithography apparatus in an SP wave illumination mode according to an embodiment of the present disclosure.

FIG. 5 is a partial schematic view showing a super-resolution imaging photolithography apparatus in an SP illumination mode according to an embodiment of the present disclosure.

When the solid immersion illumination structure (as shown in FIG. 2) or the prism illumination structure (as shown in FIG. 3) is selected, a mask substrate 501 may be fixed to the bottom surface of the solid immersion type projection illumination system 205 (as shown in FIG. 2) or the bottom surface of the prism 301 or 303 (as shown in FIG. 3) by a refractive index matching liquid or an adhesive. The mask substrate 501 may have a refractive index that is approximately identical to that of the prism 301 or 303 or the solid immersion lens 205.

The SP wave illumination structure 103 (as shown in FIG. 1) may be located below the mask substrate 501 but above a mask pattern layer 503. This structure 103 may comprise, starting from the side of the illumination, an excitation layer structure 5021, a coupling layer 5022, and a filter layer composed by multiple films of metal layers 5023 and dielectric layers 5024 in an alternate manner (for simplicity, only three pairs of metal layers 5023 and dielectric layers 5024 are shown in FIG. 5).

The excitation layer structure 5021 may comprise a nano pattern layer provided on the mask substrate. This excitation layer structure may receive a far field illumination light beam 513, and excite an SP wave with a specific wavelength. The nano patterns included in the excitation layer 5021 may comprise a 1D or 2D pattern, for example, a grating structure with a certain period. Far field illumination light beams in different directions excite SP waves on the surface in corresponding directions.

The coupling layer 5022 assists the SP waves to be coupled high-efficiently into the filter layer. The coupling layer 5022 may comprise but not limited to a dielectric film with a high refractive index, such as, $TiO_2$. The filter layer may comprise alternating multilayers of a metal and a dielectric, wherein each layer may have a nano-scale thickness. The structure comprises but not limited to alternating multilayers of Al and dielectric layers of $MgF_2$. The filter layer may reduce the stray light interference at other orders generated during the SP excitation process of the excitation layer structure 5021. As a result, a substantially uniform SP wave illumination may be formed on the upper surface of the mask pattern layer 503.

As shown in FIG. 5, the mask structure 104 may comprise, starting from the side of the illumination, a mask pattern layer 503, a padding layer 504, an imaging film 505, a protective film 506, and a gap spacer film 507.

The padding layer 504 that is under the mask layer 503 may comprise a dielectric material, comprising but not limited to PMMA (PolyMethylMethAcrylate) or the like. The imaging layer 505 may comprise a metal film, with a permittivity whose real part has an absolute value being approximately equal to that of the padding layer 504. The imaging layer 505 may comprise but not limited to Ag, Au, Al, or the like. For example, for an i-line mercury lamp light source with a center wavelength of 365 nm, the imaging metal film may comprise Ag, and for a photolithography light source with a center wavelength of 193 nm, the imaging metal film may comprise Al.

The protective layer 506 may prevent the imaging layer and the pattern layer in the mask structure from being damaged physically and corrupted chemically. The protective layer may have a thickness of 5-10 nm, and its material may comprise but not limited to a compact film, such as, $SiO_2$, diamond, or the like.

The gap spacer film 507 may form a gap with a fixed size in an exposed pattern region for a passive control mode for the gap.

Based on the selection of the illumination light and the pattern line width for the imaging photolithography, and also in consideration of the convenience of the manufacture and photolithography process for the super resolution imaging structure, one, some, or all of the SP wave illumination excitation structure 502 (above the mask pattern layer 503), and the padding layer 504, the imaging layer 505, and the protective layer 506 (below the mask pattern layer 503) may be selectively removed, though this may cause some degradation of the performance of the imaging photolithography.

As shown in FIG. 5, the photolithography substrate structure 105 may comprise, starting from the side of the illumination, an accessorial imaging film 509, a photosensitive layer 510, and a reflective layer 511, and all three of them are stacked on a photolithography substrate 512. These three layers, i.e., the accessorial imaging film 509, the photosensitive layer 510, and the reflective layer 511, constitute an SP resonance cavity imaging structure. The reflective layer 511 may be used to adjust a proportion of an electric field component within the photosensitive layer to improve the contrast of the imaging photolithography. In view of the convenience of the subsequent photolithography processes, the accessorial imaging film 509 above the photoresist may be removed, though this may cause some degradation of the performance of the imaging photolithography.

The accessorial imaging layer 509 above the photosensitive layer and the reflective layer 511 below the photosensitive layer each may comprise a metal material with a negative permittivity within the wavelength range of the light source, a real part of which may be approximately equal in magnitude to a real part of a permittivity of the dielectric padding layer 504 and the photosensitive layer 510. The metal material may comprise but not limited to Ag, Au, Al, or the like. For an i-line mercury lamp light source with a center wavelength of 365 nm, the accessorial imaging film may comprise Ag, and for a photolithography light source with a center wavelength of 193 nm, the accessorial imaging film may comprise Al.

The illumination helps to image the mask pattern included in the mask pattern layer 503 into the photosensitive layer 510 on the photolithography substrate through the padding layer 504, the imaging layer 505 and the protective layer 506, the isolation layer 508 of vacuum, air or liquid, and the accessorial imaging film 509. The nano pattern layer 503 may comprise a 1D or 2D pattern. The lines of the mask pattern may be arranged in substantially the same direction as the direction of lines of the nano pattern in the excitation layer or the direction of the off-axis illumination.

The high NA off axis light illumination mode or the SP wave illumination mode may be selected based on the size of the line width of the pattern and the structure of the pattern for the super resolution imaging photolithography.

Given the fact that most of integrated circuit patterns are 1D or 2D, dense or sparse nano patterns, and that the dense nano patterns are the key point for the resolution, how to select a corresponding illumination mode based on the photolithography pattern will be described below with respect to the nano patterns. Please note that the criteria for the selection are not strictly limited, and can be varied based on the feasibility and convenience.

According to one embodiment, for a mask pattern with a line width of ⅙ of the wavelength or above, a 1D or 2D prism off axis illumination mode with a high NA, an immersion type projection objective lens illumination mode, or a grating illumination mode may be selected.

By using a high NA off axis illumination, it is possible to efficiently improve the contrast of the super resolution imaging with respect to the line width of ⅙ of the wavelength or above, such that super resolution imaging photolithography via a gap may be achieved. The principal ray angle θ of such a high NA off axis illumination may satisfy equation (2):

$$2 \times n \times d \times \sin(\theta) = \lambda_0 \quad (2)$$

Where d denotes a period of dense line pattern in the mask, θ denotes the angle between the principal ray and the normal in the mask substrate, $\lambda_0$ denotes the wavelength of the light source in vacuum, and n denotes the refractive index of the mask substrate material. $n \times \sin(\theta)$ denotes the NA of the illumination. In practice, equation (2) may not be satisfied strictly for convenience of applications, and a tolerance within +/−20%, for example, is acceptable, though this might cause some degradation of the performance of the imaging photolithography. For example, $n \times \sin(\theta)$ is in a range of $0.8\lambda_0/(2d)$–$1.2\lambda_0/(2d)$.

It is assumed that the light emitted by the exposure light source is uniform enough. In order to achieve the high NA illumination required by equation (2), a solid or liquid immersion type projection illumination structure (as shown in FIG. 2), a solid prism illumination structure of a material having a high refractive index (as shown in FIG. 3), or a grating illumination structure (as shown in FIG. 4), or the like may be used.

The above rule for selecting the illumination structure based on the line width of the super resolution photolithography pattern is not a strict criterion. If the gap is relatively narrow, a high NA off axis illumination mode may be used even for a pattern with a line width less than or equal to ⅙ of the wavelength to improve the imaging contrast and photolithography quality.

According to another embodiment, for a pattern with a line width less than ⅙ of the wavelength, in addition to the above illumination, a structure 103 which can excite the SP wave illumination may be further incorporated above the mask pattern layer.

The use of the SP wave illumination may be equivalent to the use of a light illumination with an even higher NA. A traverse wave vector of the SP wave illumination is adjusted such that the diffracted light of the mask structure pattern is shifted in spatial frequency. Diffracted light at order −1 (or +1) and order 0 may be coupled to the transmission spectrum of the imaging system to interfere with each other, thereby improving the contrast. The SP wave illuminates the mask pattern and thus the transmitted light carries the pattern information, and then passes through the padding layer 504, the imaging layer 505 and the protective layer 506, the isolation layer 508 of air or liquid, and the accessorial imaging layer 509, to image the pattern in the mask structure into the region of the photosensitive layer 510 in the photolithography substrate structure.

The SP wave illumination excitation structure 103, the illumination light, the mask pattern may satisfy the following equations (3) and (4):

$$2d(d_s \times n \times \sin\theta + \lambda_0) = \lambda_0 d_s \quad (3)$$

$$\lambda_{sp}(d_s \times n \times \sin\theta + \lambda_0) = \lambda_0 d_s \quad (4)$$

where d denotes the period of the mask dense line pattern, $d_s$ denotes a grating period of the excitation layer 5021, $\lambda_0$ denotes the center wavelength, $\theta$ denotes an incident angle of a central light ray of the illumination light in the mask substrate, n denotes the refractive index of the mask substrate material, $\lambda_0$ denotes the center wavelength of the far field illumination light beam, and $\lambda_{sp}$ denotes the wavelength of the excited SP wave. In practice, equations (3) and (4) may not be satisfied strictly for convenience of applications, and a tolerance within +/−20%, for example, is acceptable, though this might cause some degradation of the performance of the imaging photolithography.

The generation of the far field illumination light 513 may use one of the above high NA illumination structures as shown in FIG. 2, FIG. 3, and FIG. 4, but not limited thereto.

According to another embodiment, for a mask pattern layer that is configured with aperiodic sparse lines, on the basis of the above methods, the mask pattern structure may be further optimized to achieve a better imaging photolithography effect in case of a relatively wide gap.

Figure 6A:
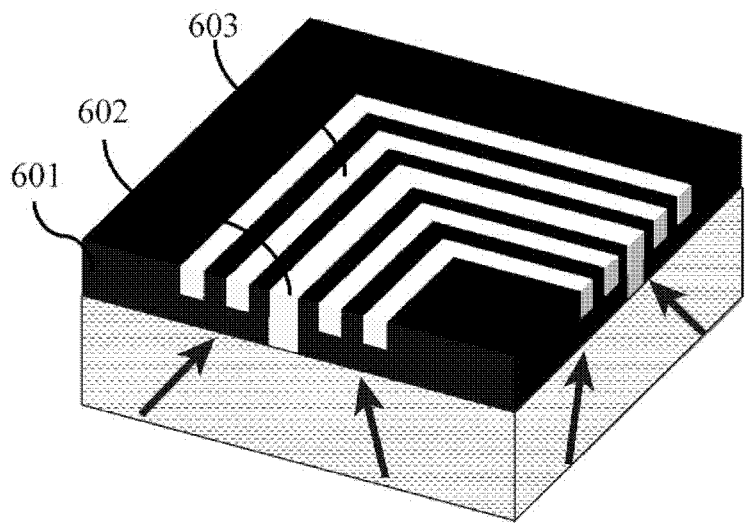
FIG. 6(a) is a schematic view showing a mask pattern structure for achieving aperiodic, sparse line pattern imaging photolithography according to an embodiment of the present disclosure.
Figure 6B:
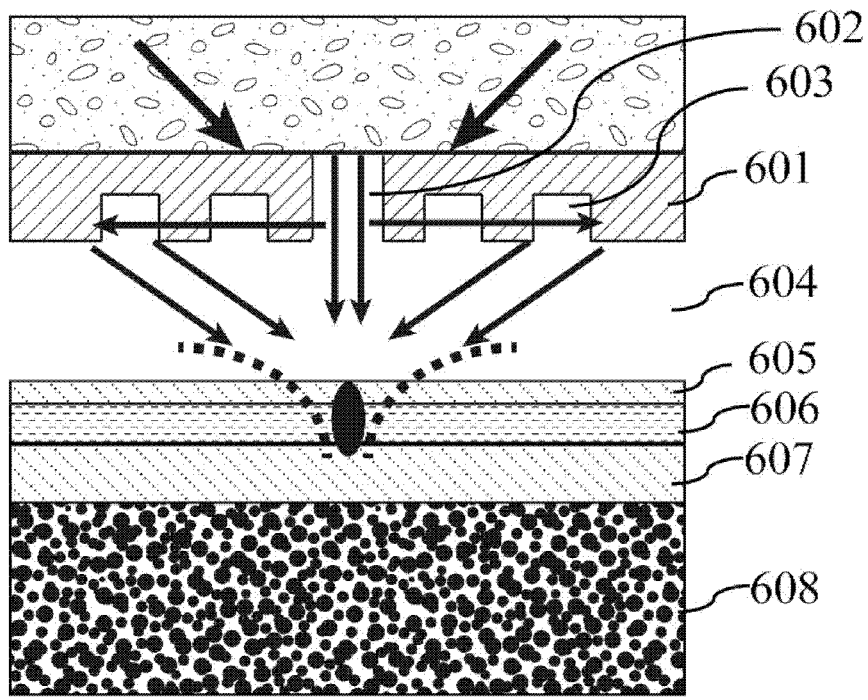
FIG. 6(b) is a cross sectional view showing an imaging photolithography structure.

As shown in FIG. 6, on a metal film 601 for the mask pattern layer, for the sparse line pattern, 1 or 2 groove structures 603 may be added symmetrically on both sides of a transparent line 602 of the pattern. With the illumination light, the grooves, and the accessorial imaging film, the photosensitive layer, and the reflective layer on the photolithography substrate functioning together, the evanescent wave in the transmission field generated by the slit line 602 of the mask pattern carries the high frequency spatial information, and then, it is scattered and converged into the imaging space of the photosensitive layer, such that the divergence of the pattern is compressed to improve the imaging resolving power, as shown in FIG. 6(b). The groove 603 may have a width of about ⅓-⅕ wavelength of the light source in vacuum and a depth of about ⅕-⅐ wavelength of the light source in vacuum, and the center of the groove is spaced from the center of the slit line by about ½-⅕ wavelength of the light source in vacuum. The specific parameters may be optimized by simulations and further in view of the convenience of manufacture.

As described above, according to embodiments of the present disclosure, different illumination modes may be used to improve the performance of the imaging photolithography, and this is different from the conventional off axis illumination for improving the performance of the projection photolithography objective lens. According to embodiments of the present disclosure, based on characteristics of the super resolution imaging photolithography and the pattern line width, an appropriate high NA illumination mode can be selected to reach the scope of the evanescent wave or the SP wave. In embodiments of the present disclosure, the generation of the illumination is different from the off axis illumination for the objective lens in the conventional projection photolithography. For example, a prism illumination structure with a high refractive index, an SP excitation and unwanted wave filter or the like can be used.

According to an embodiment of the present disclosure, a super resolution imaging photolithography apparatus is provided. The apparatus may comprise an illumination light source, an illumination system, an imaging photolithography module, an imaging gap monitoring module, a worktable system, an alignment optical system, and a control system.

The illumination system 101 may comprise a projection illumination module which is configured to achieve bipolar, quad-polar, or annular form light shaper, a prism illumination module, a grating illumination module, or the like.

The imaging photolithography module may comprise the above mask structure 104, the photolithography substrate structure 105, and an assembly control mechanism.

The imaging gap monitoring module may monitor the gap between the bottom surface of the mask structure 104 and the upper surface of the photolithography substrate structure 105 in real time, and it comprises but not limited to an FTP test module, a white light interferometer test module, a capacitance displacement sensor, or the like.

The alignment optical system may use rough mark alignment and precise alignment utilizing Moire fringe.

The control system may control the gap between the mask structure 104 and the photolithography substrate structure 105 in a passive control mode and/or an active control mode.

The mask substrate is fabricated precisely and has a highly flattened surface. To facilitate the passive gap control, a gap spacer isolation layer may be incorporated on the bottom surface of the mask structure to form a window structure enclosing a pattern region. The window has a height that defines the gap height. The worktable system has an adaptive orientation structure, for example, a flexible hinge, etc.

The passive control may be performed as follows. As described above, an illumination structure and parameters may be selected based on the line width and type of the photolithography pattern. The mask structure 104 is moved to bring the bottom surface of the mask structure 104, which has the gap isolation layer, close to the photolithography substrate structure 105. By the gap monitoring module, in conjunction with the worktable orientation mechanism, the gap is controlled in a range of, for example, about 1 μm-10 μm on average. By the alignment optical system, the worktable is moved and rotated to achieve alignment. The mask structure 104 having the gap isolation layer is kept moving to achieve a large area of uniform contact between the gap window structure and the upper surface of the photolithography substrate structure 105. Further, a thin mask substrate or a thin photolithography substrate may be used, comprising but not limited to a fused quartz piece with a thickness of 0.1 mm-0.5 mm. By increasing the air pressure on the mask substrate, a large area of uniform contact between the bottom surface of the mask structure 104 having the gap isolation layer and the upper surface of the photolithography substrate structure 105 is achieved. During exposure process, although the mask substrate and the photolithography substrate partially contact each other physically, the mask structure 104 is always spaced from the upper surface of the photolithography substrate structure 105 by a fixed gap of air or liquid due to the presence of the window structure thereby avoiding damages to the mask pattern.

The active control may be performed, for example, as follows. The flatness within the exposure pattern region on the bottom surface of the mask structure 104 and the upper surface of the photolithography substrate structure 105 is precisely controlled with a fluctuation of about 10 nm. By using the gap monitoring module, in conjunction with the orientation and displacement mechanisms of the worktable system, based on requirements of the imaging photolithography design, the gap for the exposure pattern region is controlled in a range of, for example, about 20 nm-200 nm on average.

The technology of the present disclosure may be presented in various ways, and some examples thereof will be described below.

The center wavelength of the mercury lamp light source is i-line 365 nm. In this embodiment, the illumination structure comprises a sapphire roof prism (1D photolithography pattern) 301 or a frustum of square pyramid sapphire prism (2D photolithography pattern) 303 shown in FIGS. 3(a) and 3(b), respectively. In this example, the light incident surface of the mask substrate is disposed in tight contact with the light exiting surface of the prism. For example, the mask substrate is fixed to the light exiting surface of the prism by a refractive index matching liquid or an adhesive.

Figure 3C:
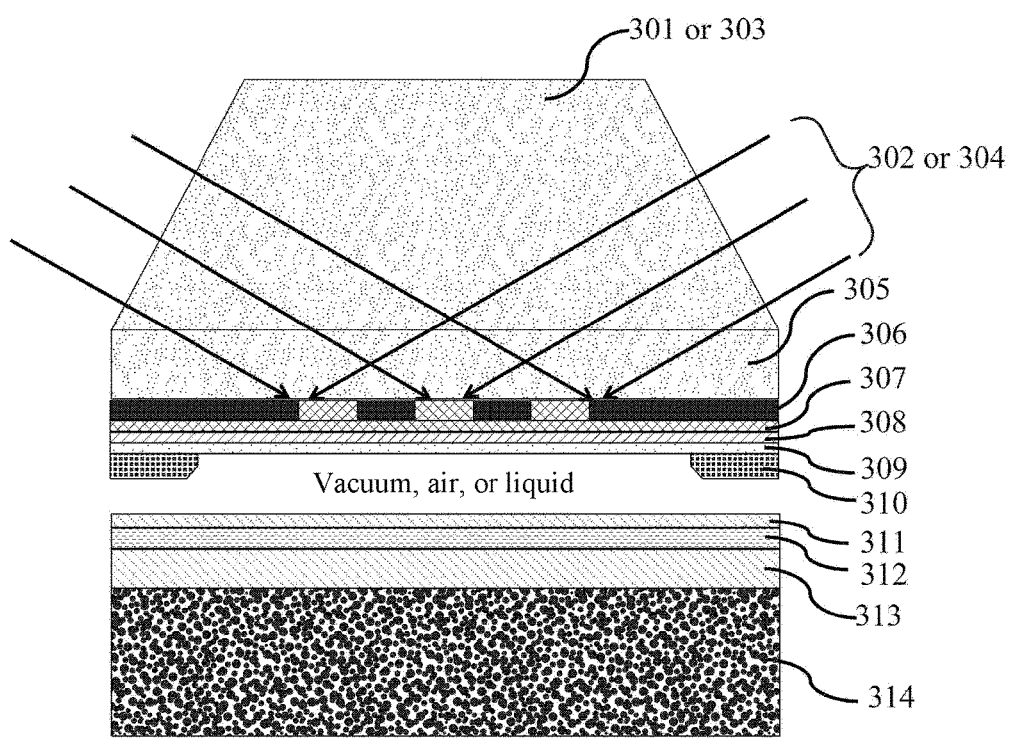
Figure 4:
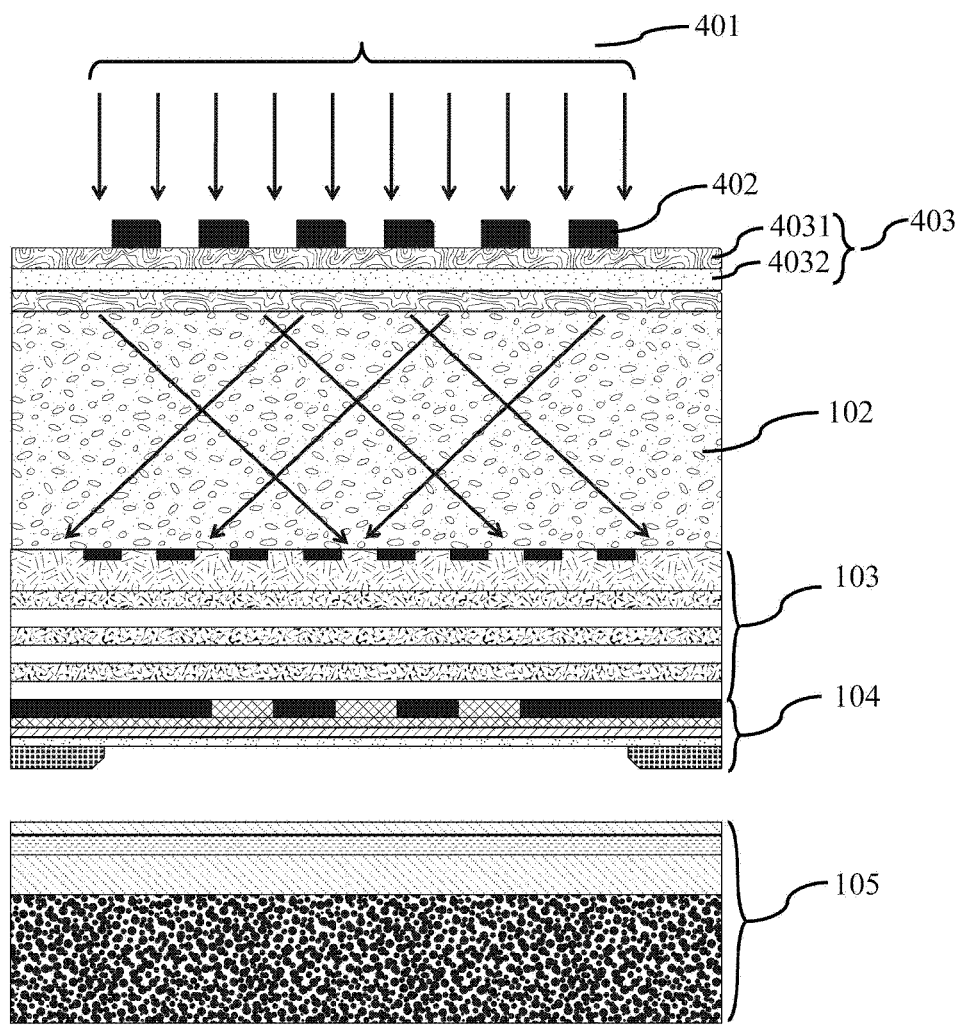
FIG. 4 is a schematic view showing a grating illumination structure for achieving super-resolution imaging photolithography according to an embodiment of the present disclosure.

As shown in FIG. 3(c), a sapphire mask substrate 305, a metal mask pattern layer 306 of chromium, a PMMA padding layer 307 with a thickness of 10 nm, a metal imaging film 308 of silver with a thickness of 20 nm, and a metal gap spacer layer 310 of chromium with a thickness of 50 nm are used. Light from the mercury lamp light source with a center wavelength of 365 nm is homogenized, and then divided into two light beams 302 or four light beams 304 which illuminate the surface of the mask pattern from two side faces of the sapphire roof prism or four side faces of the square frustum symmetrically. The illumination angle of the principal illumination ray in the prism is 60°. The refractive index of the prism is 1.8, and the corresponding illumination NA is 1.5.

The photolithography substrate structure 105 comprises, from top to bottom, an upper accessorial imaging silver film 311 with a thickness of 20 nm, a photosensitive layer of photoresist 312 with a thickness of 30 nm, a silver film reflective layer 313 with a thickness of 50 nm, and a fused quartz substrate 314 with a thickness of 1 mm.

During the exposure, the bottom surface of the mask structure is in tight contact with the upper surface of the photolithography substrate structure. Due to the presence of the gap spacer layer 310, an air gap with a thickness of 50 nm is formed to protect the mask pattern layer structure efficiently. The off axis illumination (with an NA of 1.5) in the prism passes through the mask, and images the mask nano pattern to the photosensitive layer on the fused quartz substrate. By steps such as exposing, removing the accessorial imaging silver film on the photoresist, and developing, the imaging photolithography for the nano pattern is achieved.

Assume a case of 1D dense line pattern, where the line width is 60 nm, the mask depth is 50 nm, the period is 120 nm, the duty cycle is 1:1, and the thickness of the air gap is 50 nm.

Figure 7:
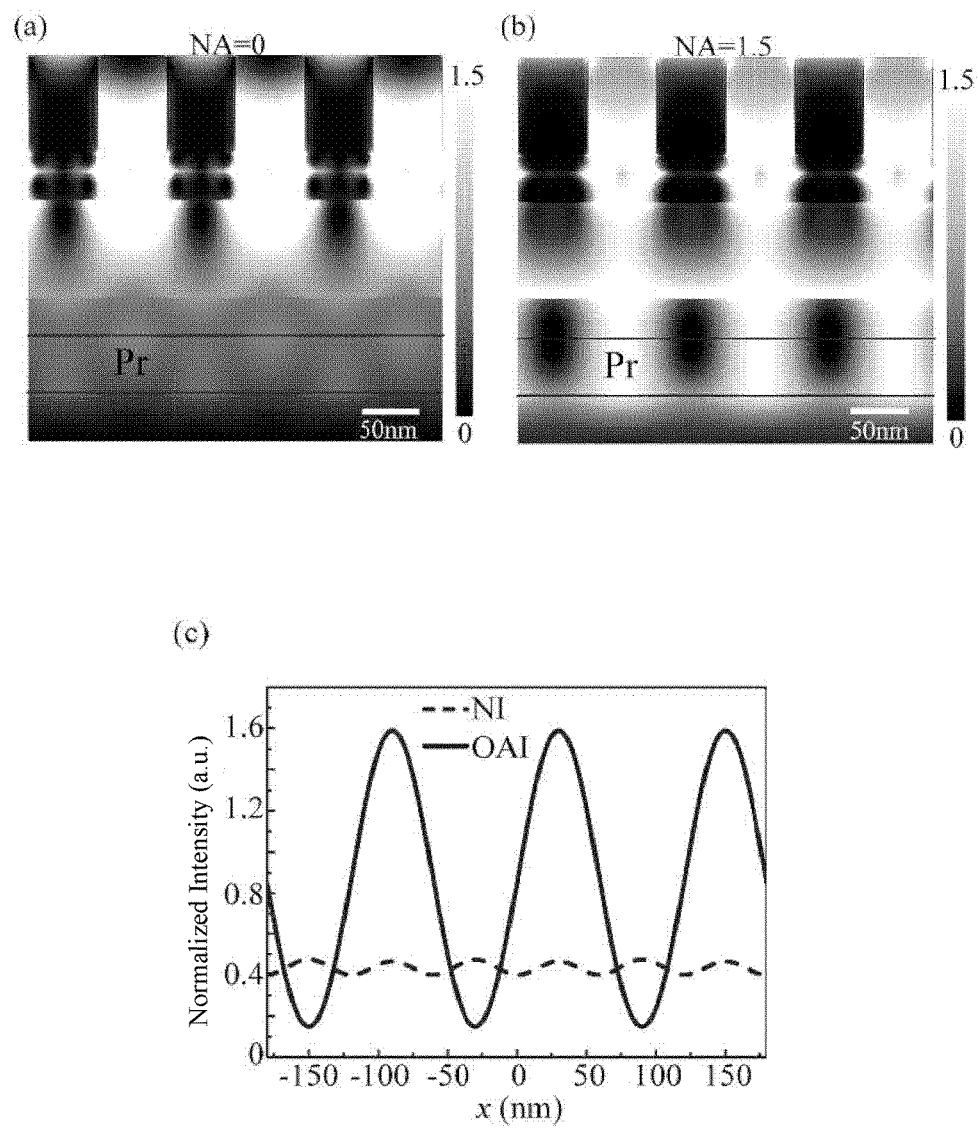
FIG. 7 shows a simulation result and a comparison result of imaging photolithography for a 1D dense line pattern with a line-width of 60 nm under different illumination modes according to an embodiment of the present disclosure, wherein NI represents Normal Illumination with NA=0, and OAI represents Off Axis Illumination with NA=1.5 and air gap=50 nm.

The result of the imaging light field of this embodiment is simulated by numerical simulation. The permittivity of Cr, Ag, and the photosensitive layer are $-8.55+8.96i$, $-2.4012+0.2488i$, and 2.59, respectively. The simulated imaging result is shown in FIG. 7, which shows simulated imaging results under a normal illumination condition (NA=0, FIG. 7a) and under the condition of this embodiment (NA=1.5, FIG. 7b), respectively. FIG. 7c shows the cross section intensity distribution of the image field in the two illumination modes, and their imaging contrasts are 0.25 and 0.83, respectively. Obviously, according to this embodiment, when NA=1.5, a good quality of imaging photolithography is achieved in the photosensitive layer.

Figure 8:
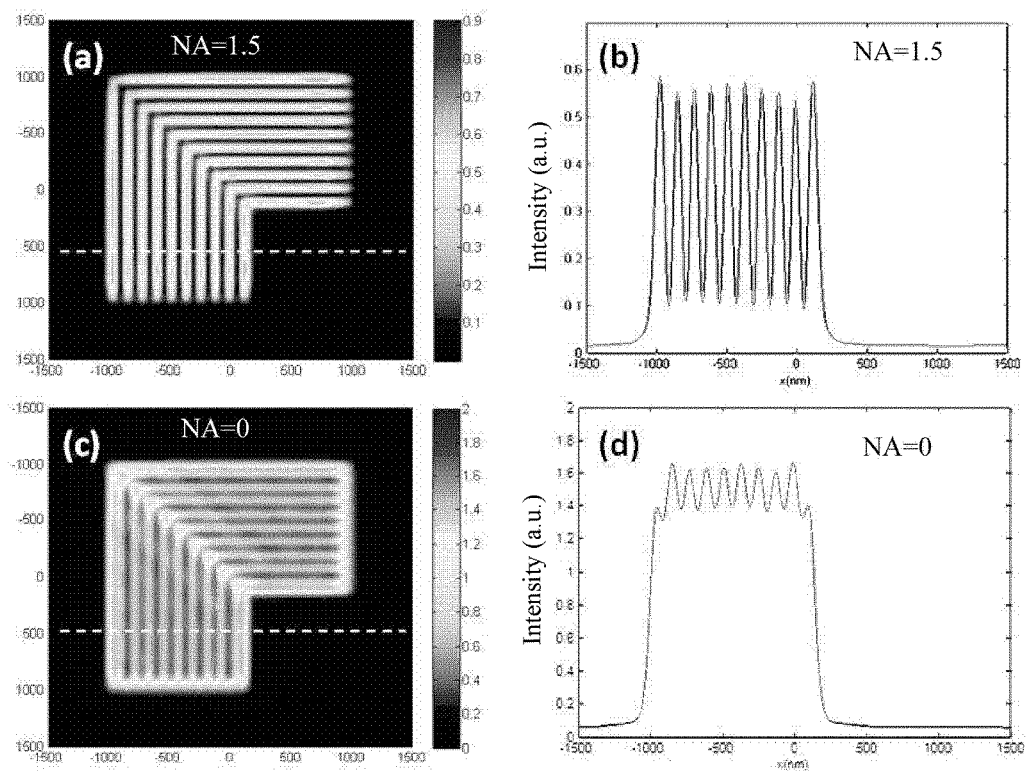

FIG. 8 shows a simulation result of a 2D 90° bend dense nano-lines pattern with a line width of 60 nm. The line width of the mask pattern layer is 60 nm, and a center-to-center distance between two adjacent lines is 120 nm. The air gap is set to be 50 nm. In this case, after being homogenized, the illumination light beam is divided into four beams, which then illuminate the surface of the mask pattern symmetrically from four side faces of the square sapphire prism 303 at an incident angle of 60° inside the prism. The azimuth angles are 0°, 90°, 180°, and 270°, respectively.

FIG. 8(a) shows a simulation result of an imaging field in the photoresist in a case of Off Axis Illumination with a high NA=1.5. FIG. 8(b) shows a cross section of intensity distribution of the image field corresponding to the observation line in FIG. 8(a), and the contrast is 0.7. FIG. 8(c) shows a simulation result of an imaging field in the photoresist in a case of Normal Illumination (NA=0). FIG. 8(d) shows a cross section of intensity distribution of the image field corresponding to the observation line in FIG. 8(c), and the contrast is 0.07. The simulation results show that the contrast and photolithography resolving power for a near field imaging pattern may be improved well by using a high NA illumination field.

Figure 9:
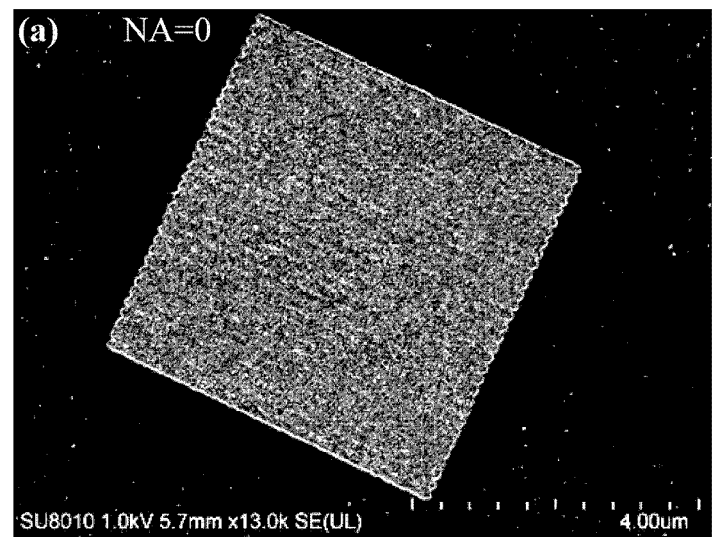
FIG. 9 shows a comparison between results of imaging photolithography experiments for a dense line pattern with a line-width of 60 nm under different illumination modes according to an embodiment of the present disclosure.
Figure 9:
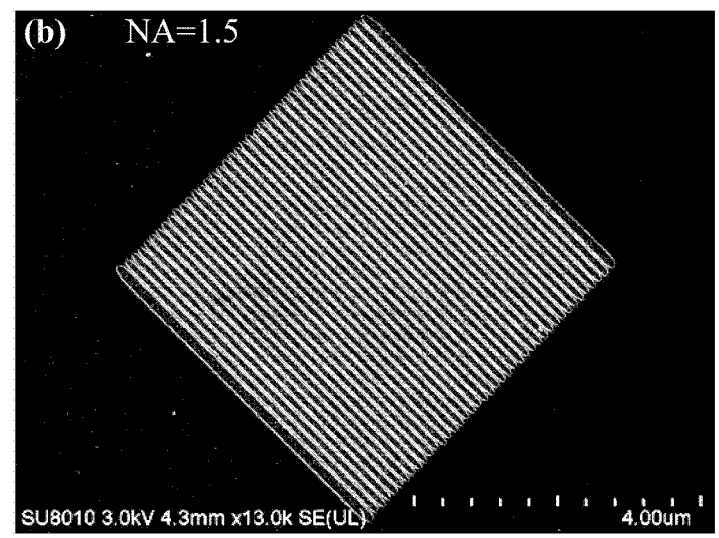

With the technology of the present disclosure, different photolithography experiments are conducted. FIG. 9 shows experimental results of photolithography of the dense line pattern with a line width of 60 nm and a gap of 60 nm, under different illumination of NA=0 (FIG. 9(a)) and NA=1.5 (FIG. 9(b)), respectively. Comparatively, the imaging photolithography result of NA=1.5 is improved in terms of both the contrast and the imaging quality.

In the embodiment shown in FIG. 5, assume a case of the SP wave illumination, a pattern with a line width of 32 nm, and a dense line pattern with a period of 64 nm. The wavelength of the used i-line mercury lamplight source is 365 nm.

According to equations (3) and (4), an optimal equivalent NA of the SP illumination is 2.8. In order to be compatible with patterns with different line widths and to facilitate the implementation, an SP illumination structure with an equivalent NA of 2.5 is designed in the present embodiment.

The substrate 501 comprises fused quartz. As shown in FIG. 5, there are two incoherent beams in the far field illumination light field 513, wherein respective principal rays thereof are at incident angles of ±28° (the angle between the principal ray and the normal in the fused quartz substrate material). The grating pattern in the SP excitation layer 5021 has a period of 200 nm, a depth of 40 nm, and a duty cycle of 1:1. For a 1D photolithography mask line pattern, the excitation grating 5021 is in a 1D structure, and its direction is substantially the same as the direction of the photolithography mask line. The grating excitation layer 5021 may receive the far field illumination light beam 513 to efficiently excite an SP wave illumination with a certain wavelength.

The coupling layer 5022 below the SP excitation layer comprises a $TiO_2$ film with a thickness of 75 nm and a multiple film structure, which is stacked by 5 pairs of 15 nm thick metal Al films and 15 nm thick dielectric $MgF_2$ films alternately, as an SP unwanted wave filter layer. The permittivity of $SiO_2$, $TiO_2$, $MgF_2$, and Al are 2.13, 14.91+1.94i, 1.932, and −19.4238+3.6028i, respectively.

Figure 10:
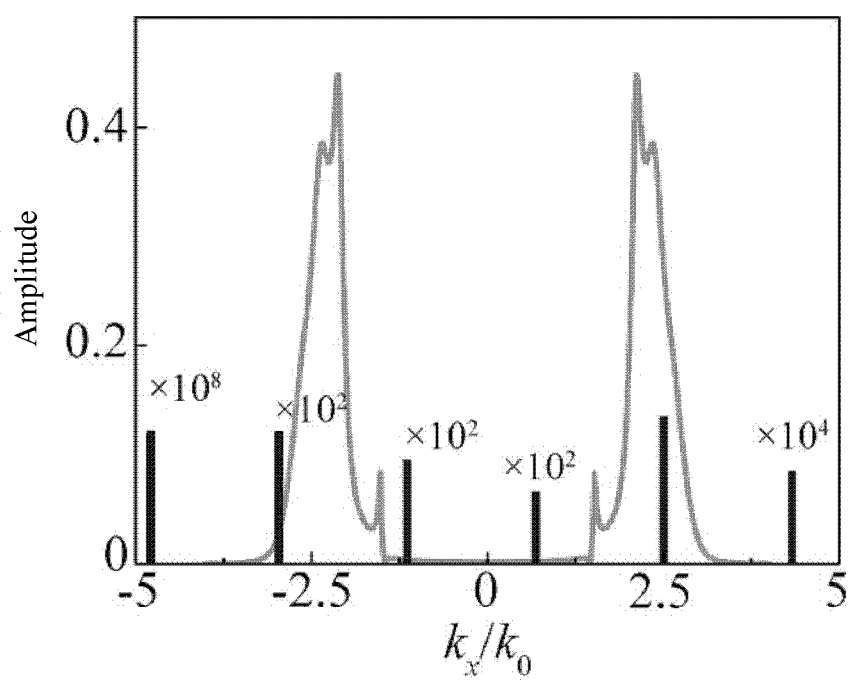
FIG. 10 is a graph showing an amplitude distribution of spatial spectrum of a light excited by an SP wave illumination structure which is designed for a line-width of 32 nm according to an embodiment of the present disclosure, wherein the gray curve represents an optical transfer function (OTF) curve for a film structure which acts as a filter in the SP wave illumination structure.

The numerical simulation result of FIG. 10 shows that the unwanted wave filter layer, that is, the multiple film structure of alternating $MgF_2$/Al, has a good filtering effect. The gray curve in FIG. 10 shows the OTF curve of the dielectric-metal multiple film structure composed of 5 pairs of alternating $MgF_2$/Al ($k_x$ in the figure represents the traverse wave vector of the illumination light). The transmission window of the spatial wave vector for the multilayers ranges from $1.5\lambda_0$ to $3\lambda_0$ ($\lambda_0$ represents a wave vector in vacuum). The far field illumination light illuminates the grating in the SP excitation layer 5021 to generate an SP wave illumination 514 with a traverse wave vector of $2.5\lambda_0$. Further, the transmittance of the illumination spatial spectrum is shown by the black histogram in FIG. 10. From FIG. 10, it can be observed that the intensity of the illumination is concentrated at $2.5\lambda_0$ in the spatial spectrum, and the transmittance at other frequencies is suppressed efficiently.

The mask pattern layer 503 is placed directly on the illumination generation structure (in this example, at the bottom of the SP excitation structure 502). The SP wave illuminates the mask pattern, so that the contrast of the imaging field in the photosensitive layer may be greatly improved, even with the presence of the air gap.

Assume a case where the line width of the pattern is 32 nm, the period of the pattern is 64 nm, and the duty cycle of the pattern is 1:1. Such a mask pattern may be formed by a patterned metal material, such as, Cr. The Cr layer may have a thickness of, for example, 40 nm. For ease of the implementation, an air gap is arranged below the mask pattern.

The photosensitive layer 510 comprises photoresist with a thickness of 30 nm. The substrate 512 may comprise quartz with a thickness of, for example, 1 mm. Above the photosensitive layer 510, on the side facing the illumination, an Ag layer with a thickness of 15 nm is arranged as the accessorial imaging layer. Below the photosensitive layer 510, on the side opposite to the illumination light, a metal silver reflective layer 511 with a thickness of 70 nm is arranged. The three layers are stacked on the quartz substrate 512.

Figure 11:
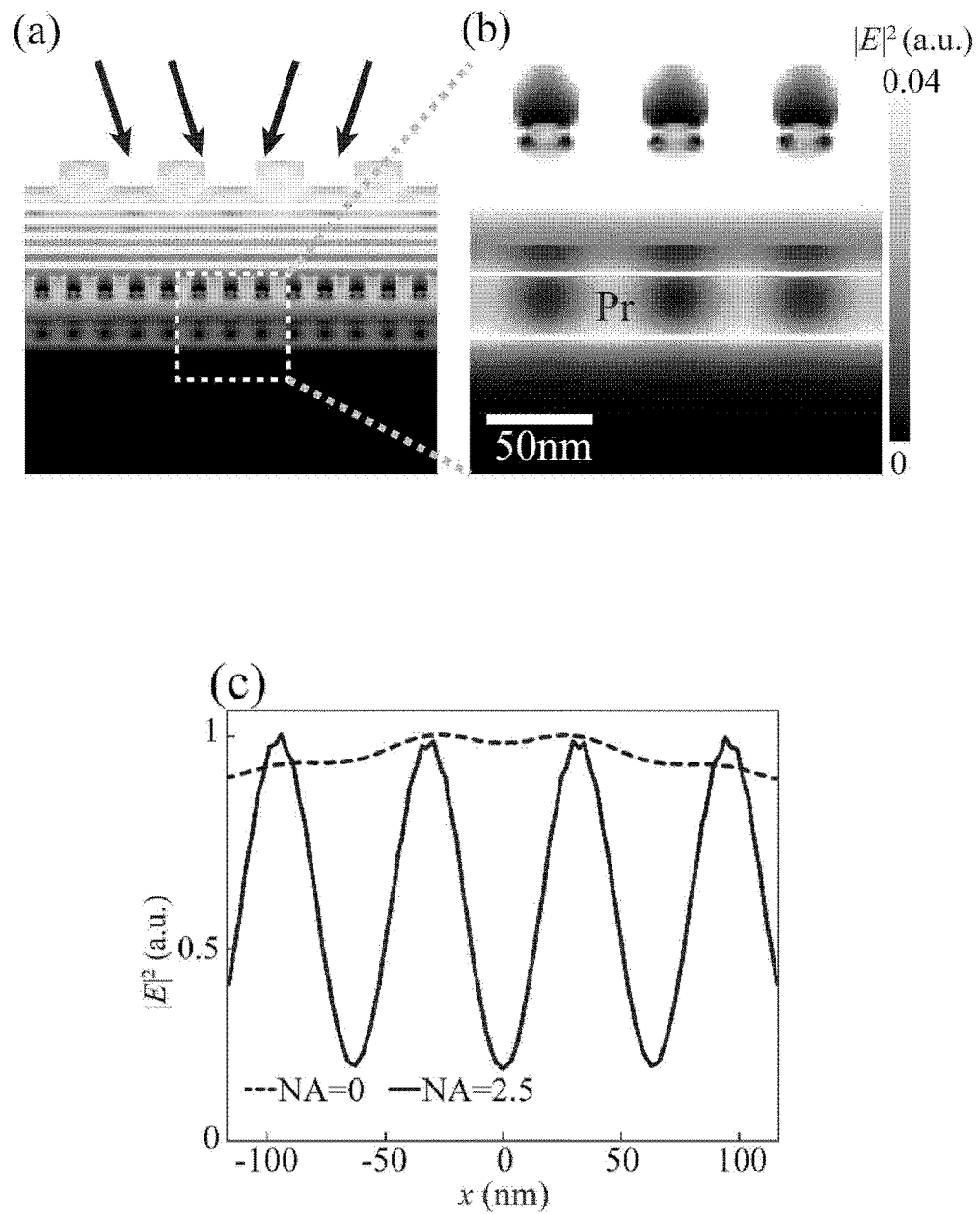

By the numerical simulation, the imaging field distribution in the photoresist in this embodiment is simulated. The permittivity of Cr, Ag, and the photosensitive layer are −8.57+8.66i, −2.4012+0.2488i, and 2.59, respectively. A simulated imaging result of a 1D dense line pattern is shown in FIG. 11, in which FIG. 11(b) shows an enlarged view of a region enclosed by the white dashed line of FIG. 11(a). From the comparison in terms of a light intensity distribution in the imaging space as shown in FIG. 11(c), a good imaging quality is achieved in the photosensitive layer 510 with the structure of this embodiment.

The structure of the excitation layer 5021 is determined depending on the specific pattern of the mask pattern layer 503. When the mask pattern layer 503 comprises a 2D pattern, the excitation layer 5021 may also comprise a 2D pattern. Assume following conditions for simulation: the pattern of the excitation layer is a grating structure of square hole array, in which a side length of the hole is 100 nm and a center-to-center distance between adjacent holes is 200 nm; the pattern layer comprises L shaped 90° bend lines, the line width is 32 nm, and the period is 64 nm; and the incident light comprises four beams of incoherent illumination light with a center wavelength of 365 nm and an incident angle of 28°, and azimuth angles of 0°, 90°, 180°, and 270°, respectively.

Figure 12:
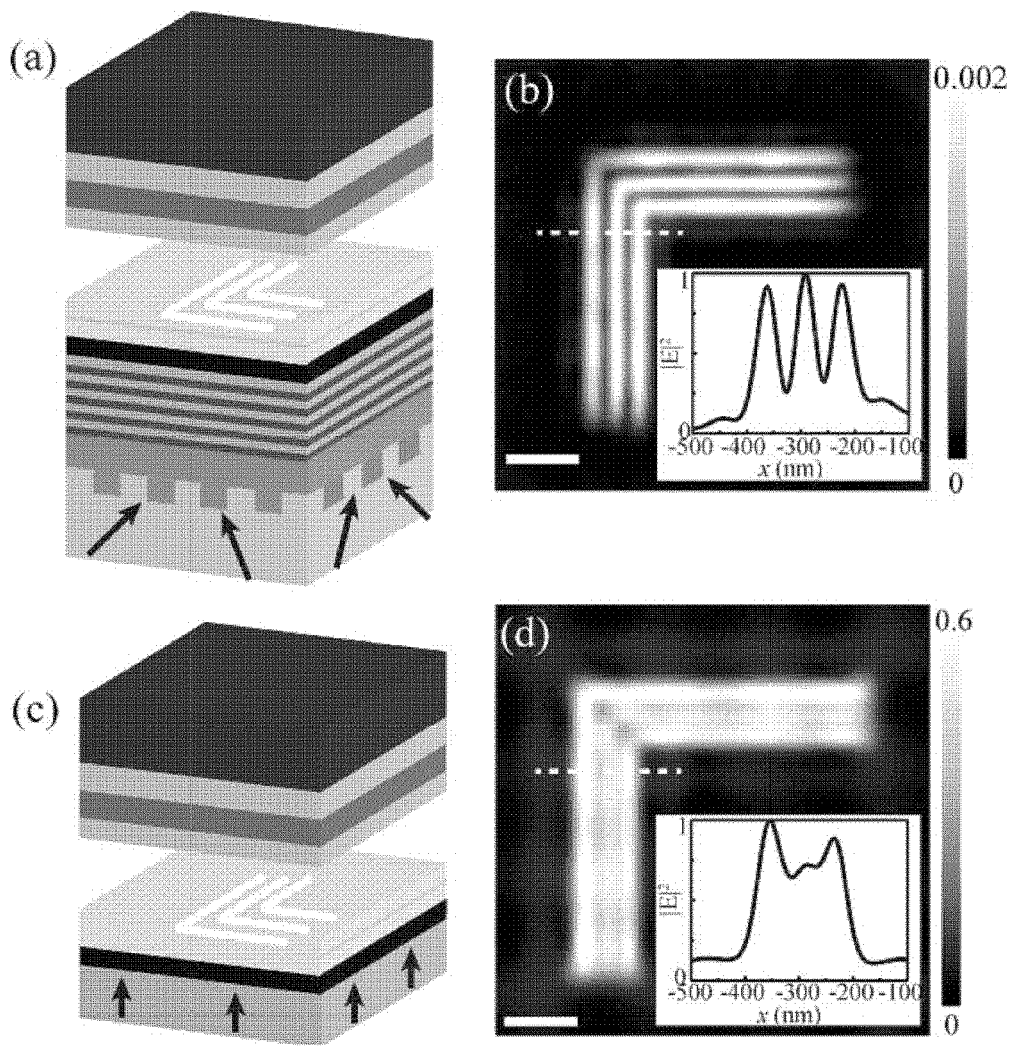

By the numerical simulation, the SP wave illumination nano imaging apparatus and the photolithography result in this embodiment are simulated. The simulated imaging result is shown in FIG. 12. FIG. 12(a) shows a schematic diagram of the imaging photolithography structure in the SP wave illumination mode. FIG. 12(c) shows a schematic diagram of photolithography in the Normal Illumination mode. FIG. 12(b) and FIG. 12(d) show the simulation results in these two modes, respectively. The overlaid figures in FIG. 12(b) and FIG. 12(d) are intensity distribution along corresponding white dashed lines. The simulation results show that the contrast and resolving power of the super resolution imaging photolithography may be improved well with the SP wave illumination which operates on the nano imaging photolithography structure.

Figure 13:
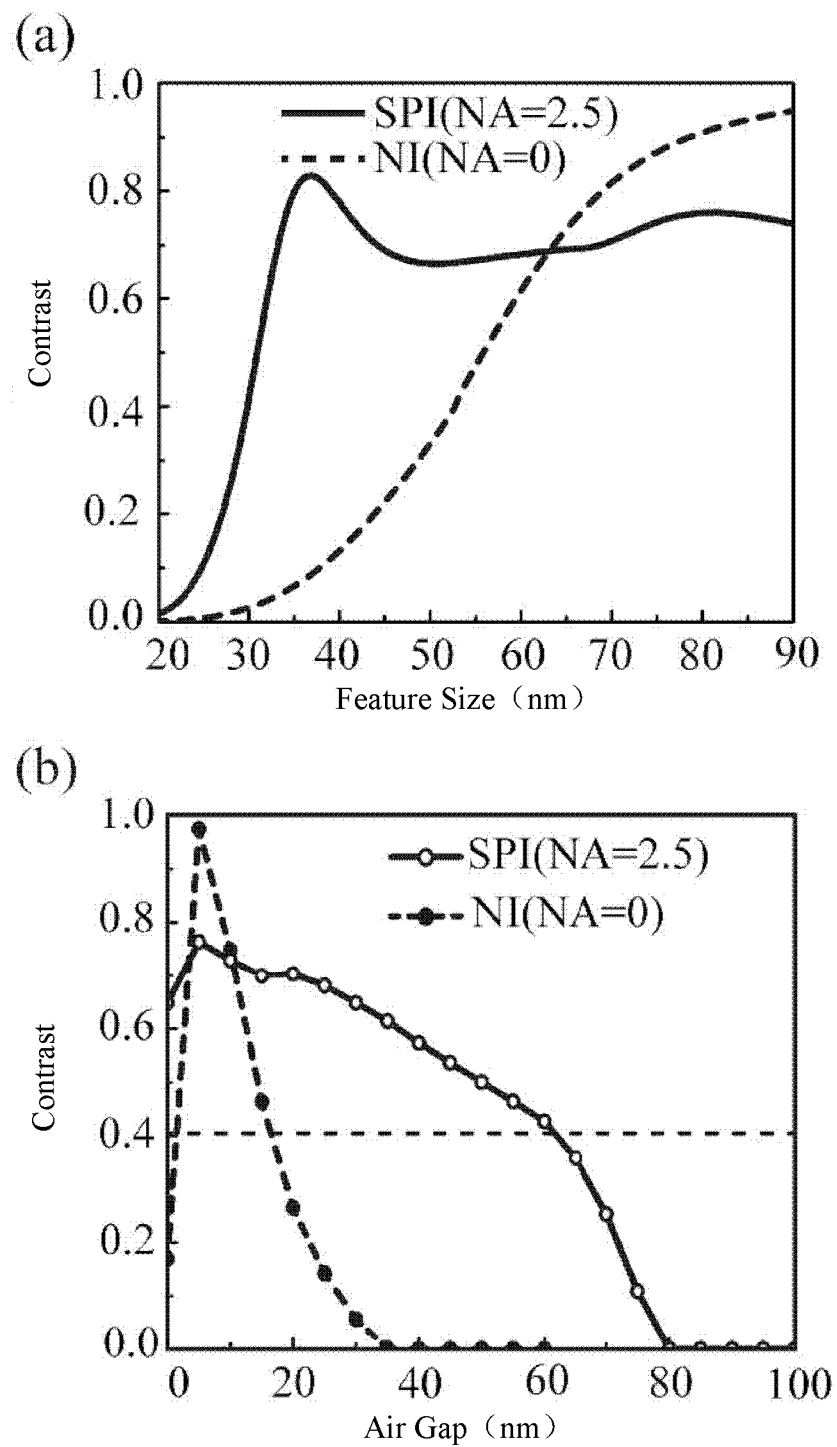
FIG. 13(a) shows simulated results of imaging contrast achieved by a super-resolution imaging structure in different illumination modes but with the same air gap (40 nm) for line patterns with different line-widths according to an embodiment of the present disclosure.
FIG. 13(b) shows simulated results of imaging contrast achieved for a dense pattern with a line-width of 32 nm in different illumination modes under different air gaps according to an embodiment of the present disclosure, in which SPI represents an SP wave illumination with NA=2.5, and NI represents a normal illumination with NA=0.

FIG. 13 shows respective contrast curves of the SPI (SP Illumination) mode and the NI (Normal Illumination) mode under different line widths in a case where the traverse wave vector of the SP wave is $2.5\lambda_0$ and the air gap has a thickness of 40 nm (FIG. 13(a)), and also respective contrast curves of the SPI mode and the NI mode with respect to the dense line pattern with a line width of 32 nm under different air gaps (FIG. 13(b)). From FIG. 13(a), it can be observed that this structure maintains high contrast imaging for dense line patterns with a line width equal to or greater than 32 nm under the conditions of the fixed SP wave illumination parameters and the 40 nm air gap. Further, from FIG. 13(b), it can be observed that the air gap may be extended to 60 nm if a criterion that the intensity contrast of the image in the photosensitive layer is greater than 0.4 is used. Comparatively, for the imaging photolithography structure with normal illumination, the air gap is limited to only about 10 nm.

The present disclosure proposes a method for super resolution imaging optical photolithography, which is also effective to sparse nano line patterns. Here, an example of super resolution imaging photolithography for a single line mask pattern with a line width of 60 nm will be described.

In this embodiment, the same imaging photolithography structure and parameters as the previous embodiment are used, as shown in FIG. 6. As shown in FIG. 6(a), two sets of metal groove structures 603 are incorporated symmetrically on both sides of the line slit 602 on the exiting surface of the chromium mask pattern with a line width of 60 nm. The center of the groove is spaced from the center of the slit by 110 nm. The width of the groove is 55 nm, and the depth of the groove is 45 nm. The thickness of the chromium film of the mask pattern layer 601 is 90 nm. As shown in FIG. 6(b), the air gap 604 is set to be 100 nm. The off axis light illumination with an NA=1.5 generated by the prism illuminates the mask pattern. The photolithography substrate structure 105 is configured to comprise: a metal silver imaging film 605 with a thickness of 20 nm, photoresist 606 with a thickness of 30 nm and a metal silver reflective layer 607 with a thickness of 70 nm, and a silicon wafer 608 with a thickness of 0.3 mm.

Figure 14:
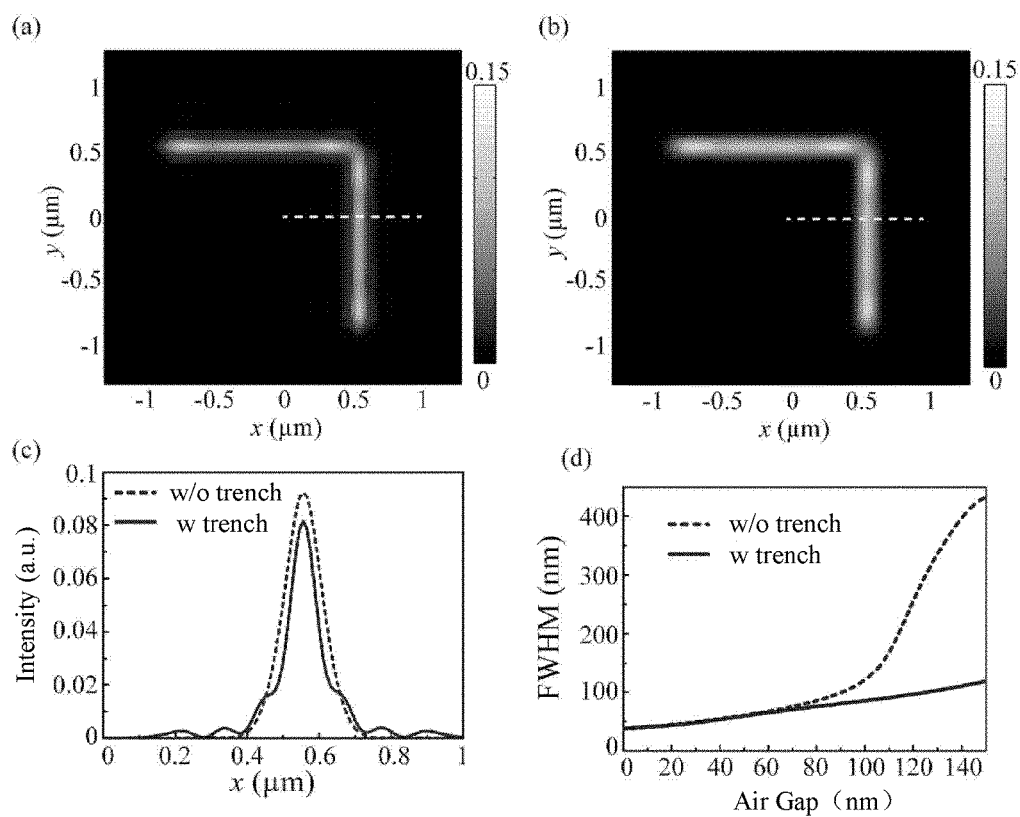

FIG. 14 shows simulated imaging results. FIG. 14(a) shows a distribution of the imaging field in the photosensitive layer region under conditions of Off Axis Illumination and the incorporated groove structures. FIG. 14(b) shows a distribution of the imaging field for a comparative structure (with Normal Illumination and no groove structure). FIG. 14(c) shows respective cross section along the white dashed lines in FIG. 14(a) and FIG. 14(b). FIG. 14(d) shows the widths of the line pattern in the photoresist under different air gaps. It can be seen that the expanse of the pattern line width is suppressed obviously, especially, the imaging line width is reduced from 300 nm to 80 nm for the case of the air gap greater than 100 nm.

According to an embodiment of the present disclosure, the photolithography imaging process may be as follows. An illumination mode is selected for a line width of a photolithography pattern. For example, for a pattern with a line width of ⅙ wavelength or above, the high NA off axis illumination mode is selected. For a pattern with a line width of ⅙ wavelength or below, under the condition of an incident light with a center wavelength of $\lambda_0$ and at a certain far-field illumination direction (specifically, an angle between a central direction of the incident light and an main axis (for example, the normal of the device surface) is $\theta$), the excitation layer in the mask structure is illuminated uniformly to excite an SP wave with a certain transmission wavelength. The light filter may be used to enhance the transmitted intensity of the SP wave. The SP wave illumination or the high NA off axis illumination may be coupled to the pattern layer in the mask structure and be transmitted to the imaging layer in the mask structure. By controlling the thickness of the isolation layer between the mask structure and the photolithography substrate structure, and with aid of the accessorial imaging layer in the photolithography substrate structure, the imaging field which carries the pattern layer passes through the isolation layer of air or liquid, and is coupling transferred to the photosensitive layer in the photolithography substrate structure. By photolithography processes, such as, exposing, removing the accessorial imaging layer, and developing, super resolution imaging photolithography is achieved in the photosensitive layer.

Although illustrative embodiments of the present disclosure are described above for better understanding the present disclosure, it should be appreciated that the present disclosure is not limited to those embodiments. For one ordinarily skilled in the art, various changes may be made therein without departing from the spirit and scope of the present disclosure, which are defined by the claims as follows. These changes should fall into the scope of the present disclosure

We claim:

1. An apparatus for super resolution imaging photolithography, comprising:
an illumination light generation device configured to generate illumination light which can pass through a mask and then image a pattern included in the mask, wherein the illumination light comprises a high-frequency spatial spectrum such that a high-frequency evanescent wave component of spatial spectrum information for the light is converted to a low-frequency evanescent wave component after being transmitted through the mask pattern,
wherein the illumination light generation device comprises a Surface Plasmon (SP) wave illumination light excitation structure configured to receive far field illumination light beams which are incident symmetrically in certain directions to generate a uniform SP wave illumination at a certain transmission wavelength,
wherein the SP illumination light excitation structure comprises an excitation layer, and the excitation layer satisfies equations (1) and (2):

$$2d \times (d_s \times n \times \sin\theta + \lambda_0) = \lambda_0 \times d_s \quad (1)$$

$$\lambda_{sp} \times (d_s \times n \times \sin\theta + \lambda_0) = \lambda_0 \times d_s \quad (2)$$

where d denotes a center-to-center pitch of dense lines in the mask pattern, $d_s$ denotes a grating period of the excitation layer, $\theta$ denotes an incident angle of a central light ray of the far field illumination light beam in a substrate for the mask, n denotes a refractive index of the mask substrate, $\lambda_0$ denotes a center wavelength of the far field illumination light beam, and $\lambda_{sp}$ denotes the wavelength of the excited SP.

2. The imaging photolithography apparatus according to claim 1, wherein the illumination light generation device is configured to further form the illumination light in accordance with a high Numerical Aperture (NA) illumination mode.

3. The imaging photolithography apparatus according to claim 2, wherein the illumination light generation device comprises:
a light source configured to emit illumination light;
a light homogenizer configured to homogenize uniform the illumination light; and
a high NA illumination light shaper configured to shape the homogenized illumination light into the illumination light containing the high-frequency spatial spectrum.

4. The imaging photolithography apparatus according to claim 3, wherein the high NA illumination light shaper comprises any of a grating illumination structure, a solid or liquid immersion type projection illumination structure, or a solid prism illumination structure with a high refractive index.

5. The imaging photolithography apparatus according to claim 3, wherein an angle $\theta$ of a principal light ray of the high NA illumination light satisfies:

$$n \times 2 \times d \times \sin\theta = \lambda_0 \quad (3)$$

where n denotes a refractive index of a substrate for the mask, $\theta$ denotes the angle between the principal light ray in the mask substrate and the normal of the mask substrate, d denotes a center-to-center pitch of dense lines included in the mask pattern, and $\lambda_0$ denotes a wavelength of the illumination light in vacuum.

6. The imaging photolithography apparatus according to claim 4, wherein the grating illumination structure is loaded on a substrate for the mask and comprises a 1D or 2D grating and a filter layer, wherein lines in the grating are arranged in a direction substantially the same as that of lines in the mask.

7. The imaging photolithography apparatus according to claim 4, wherein the high NA illumination light shaper is configured to shape the homogenized illumination light into dipolar, quadripolar, or annular illumination,
wherein the solid or liquid immersion type projection illumination structure comprises a projection illumination optical system immersed in liquid or solid, with a magnification factor of M to increase the NA of the illumination light filed to a desired NA.

8. The imaging photolithography apparatus according to claim 4, wherein the solid prism illumination structure with a high refractive index comprises a roof prism or a square frustum of pyramid prism, and wherein the homogenized illumination light is symmetrically incident from two opposing side faces of the roof prism or from four side faces of the pyramid prism into the prism, and the high NA illumination light exits from a bottom surface of the prism and illuminates the mask pattern below it.

9. The imaging photolithography apparatus according to claim 5, wherein the filter comprises one or more F-P cavity structures composed of metal and dielectric films, and is configured to filter out the influence of other diffraction orders except two orders +1 and −1.

10. The imaging photolithography apparatus according to claim 9, wherein the equation (3) is satisfied with a tolerance of about +/−20%.

11. The imaging photolithography apparatus according to claim 1, wherein the SP wave illumination light excitation structure is provided below a substrate for the mask and thus located at upstream of a mask pattern layer, such that the mask pattern is illuminated by the SP wave illumination light, and the light transmitted through the mask carries pattern information to image the pattern on a photolithography substrate structure.

12. The imaging photolithography apparatus according to claim 1, wherein the SP illumination light excitation structure further comprises a coupling layer, and a filter layer composed of multiple metal and dielectric layers stacked alternately.

13. The imaging photolithography apparatus according to claim 12, wherein the excitation layer comprises a one-dimensional (1D) or two-dimensional (2D) periodic grating pattern, with grating lines arranged in the same directions of lines in the mask pattern.

14. The imaging photolithography apparatus according to claim 1, wherein the far field illumination light beams comprise high NA illumination light.

15. The imaging photolithography apparatus according to claim 1, wherein the excitation layer satisfies the equations (1) and (2) with a tolerance of about +/−20%.

16. The imaging photolithography apparatus according to claim 1, wherein the mask comprises a mask pattern layer, a dielectric padding layer, an imaging film, a protective layer, and a gap spacer film,
wherein the imaging film comprises a metal film configured to excite SPs, with a permittivity whose real part has an absolute value being approximately equal to that of the padding layer.

17. The imaging photolithography apparatus according to claim 1, further comprising: a photolithography substrate structure comprising an accessorial imaging film, a photosensitive layer, and a reflective layer which are stacked on a photolithography substrate,
wherein the accessorial imaging film, the photosensitive layer, and the reflective layer constitute an SP resonance cavity imaging structure; and
wherein the accessorial imaging film and the reflective layer each comprise a material, a permittivity of which is negative within a wavelength range of the light source and has a real part which is approximately equal to that of the photosensitive layer.

18. The imaging photolithography apparatus according to claim 17, wherein the mask is spaced from the photolithography substrate structure by a gap of about 20 nm-200 nm thickness.

19. The imaging photolithography apparatus according to claim 18, wherein the gap has vacuum, air, or liquid provided inside.

20. The imaging photolithography apparatus according to claim 1, wherein the mask pattern comprises a 1D or 2D dense line pattern and also a sparse line pattern,
wherein the sparse line pattern is configured as a transparent slit on an opaque film, and a structure including one or two symmetrically arranged groove structures is arranged around the transparent slit, wherein the groove has a width of about ⅕-1/10 of a wavelength of the illumination light, and a depth of about ⅕-⅛ of the illumination light wavelength, and a distance from a center of the groove to a center of the slit is about ⅓-⅕ of the illumination light wavelength.

21. A method for super-resolution imaging photolithography, comprising:
forming illumination light containing a high-frequency spatial spectrum in accordance with a Surface Plasmon (SP) wave illumination mode and/or a high Numerical Aperture (NA) illumination mode;
using the illumination light to illuminate a mask pattern, resulting in light transmitted through the mask pattern, wherein a high-frequency evanescent wave component of spatial spectrum information is converted to a low-frequency evanescent wave component for the transmitted light; and
projecting the transmitted light through a certain gap onto a substrate to image the mask pattern on the substrate on which at least an imaging film, a photosensitive layer, and a reflective layer are stacked in sequence,
wherein forming the illumination light comprises forming SP wave illumination light by receiving far field illumination light beams which are incident symmetrically in certain directions,
wherein the forming the SP wave illumination comprises causing the far field illumination light beams to pass through an excitation layer, the excitation layer satisfies equations (1) and (2):

$$2d \times (d_s \times n \times \sin\theta + \lambda_0) = \lambda_0 \times d_s \quad (1)$$

$$\lambda_{sp} \times (d_s \times n \times \sin\theta + \lambda_0) = \lambda_0 \times d_s \quad (2)$$

where d denotes a center-to-center pitch of dense lines in the mask pattern, $d_s$ denotes a grating period of the excitation layer, θ denotes an incident angle of a central light ray of the far field illumination light beam in a substrate for the mask, n denotes a refractive index of the mask substrate, $\lambda_0$ denotes a center wavelength of the far field illumination light beam, and $\lambda_{sp}$ denotes the wavelength of the excited SP.

22. The method according to claim 21, wherein the gap has vacuum, air, or liquid provided inside.

* * * * *